US009806228B2

United States Patent
Jain et al.

(10) Patent No.: US 9,806,228 B2
(45) Date of Patent: Oct. 31, 2017

(54) PATTERNED LAYER DESIGN FOR GROUP III NITRIDE LAYER GROWTH

(71) Applicant: Sensor Electronic Technology, Inc., Columbia, SC (US)

(72) Inventors: Rakesh Jain, Columbia, SC (US); Wenhong Sun, Lexington, SC (US); Jinwei Yang, Columbia, SC (US); Maxim S. Shatalov, Columbia, SC (US); Alexander Dobrinsky, Loudonville, NY (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/389,479

(22) Filed: Dec. 23, 2016

(65) Prior Publication Data

US 2017/0104129 A1 Apr. 13, 2017

Related U.S. Application Data

(63) Continuation-in-part of application No. 15/212,659, filed on Jul. 18, 2016, now Pat. No. 9,680,061, which
(Continued)

(51) Int. Cl.
*H01L 27/15* (2006.01)
*H01L 31/072* (2012.01)
(Continued)

(52) U.S. Cl.
CPC .......... *H01L 33/06* (2013.01); *H01L 21/0242* (2013.01); *H01L 21/0243* (2013.01);
(Continued)

(58) Field of Classification Search
CPC ............. H01L 21/0237; H01L 21/0242; H01L 21/0243; H01L 21/0254; H01L 21/02458;
(Continued)

(56) References Cited

U.S. PATENT DOCUMENTS 4,952,526 A 8/1990 Pribat et al.
6,111,277 A 8/2000 Ikeda
(Continued)

FOREIGN PATENT DOCUMENTS

JP 2002255694 A 9/2002
JP 2006278477 A 10/2006
(Continued)

OTHER PUBLICATIONS

Ali et al., "Void shape control in GaN re-grown on hexagonally patterned mask-less GaN," Journal of Crystal Growth, 2011, 4 pages.
(Continued)

*Primary Examiner* — Hsien Ming Lee
(74) *Attorney, Agent, or Firm* — LaBatt, LLC

(57) ABSTRACT

A device having a layer with a patterned surface for improving the growth of semiconductor layers, such as group III nitride-based semiconductor layers with a high concentration of aluminum, is provided. The patterned surface can include a substantially flat top surface and a plurality of stress reducing regions, such as openings. The substantially flat top surface can have a root mean square roughness less than approximately 0.5 nanometers, and the stress reducing regions can have a characteristic size between approximately 0.1 microns and approximately five microns and a depth of at least 0.2 microns. A layer of group-III nitride material can be grown on the first layer and have a thickness at least twice the characteristic size of the stress reducing regions.

20 Claims, 16 Drawing Sheets

Related U.S. Application Data is a continuation of application No. 13/647,885, filed on Oct. 9, 2012, now Pat. No. 9,397,260.

(60) Provisional application No. 61/545,261, filed on Oct. 10, 2011, provisional application No. 61/556,160, filed on Nov. 4, 2011.

(51) Int. Cl.

| | | |
|---|---|---|
| *H01L 33/06* | (2010.01) | |
| *H01L 33/32* | (2010.01) | |
| *H01L 33/24* | (2010.01) | |
| *H01L 33/12* | (2010.01) | |
| *H01L 21/02* | (2006.01) | |
| *H01L 29/778* | (2006.01) | |
| *H01L 33/22* | (2010.01) | |
| *H01L 29/20* | (2006.01) | |
| *H01L 29/51* | (2006.01) | |

(52) U.S. Cl.
CPC ...... *H01L 21/0254* (2013.01); *H01L 21/0265* (2013.01); *H01L 21/02458* (2013.01); *H01L 21/02639* (2013.01); *H01L 29/7786* (2013.01); *H01L 33/12* (2013.01); *H01L 33/24* (2013.01); *H01L 33/32* (2013.01); *H01L 29/2003* (2013.01); *H01L 29/518* (2013.01); *H01L 33/22* (2013.01); *H01L 2933/0083* (2013.01); *H01L 2933/0091* (2013.01)

(58) Field of Classification Search
CPC ........... H01L 21/02639; H01L 21/0265; H01L 33/12; H01L 33/22
USPC ............................................ 257/79, 81, 189
See application file for complete search history.

(56) References Cited

U.S. PATENT DOCUMENTS

| | | | |
|---|---|---|---|
| 6,153,010 | A | 11/2000 | Kiyoku et al. |
| 6,294,440 | B1 | 9/2001 | Tsuda et al. |
| 6,478,871 | B1 | 11/2002 | Shealy et al. |
| 6,503,610 | B2 | 1/2003 | Hiramatsu et al. |
| 6,770,914 | B2 | 8/2004 | Shibata et al. |
| 7,473,315 | B2 | 1/2009 | Nakahata et al. |
| 9,105,792 | B2 | 8/2015 | Jain et al. |
| 9,397,260 | B2 | 7/2016 | Jain et al. |
| 2001/0003019 | A1 | 6/2001 | Morita |
| 2001/0004488 | A1 | 6/2001 | Morita |
| 2003/0047746 | A1 | 3/2003 | Kuniyasu et al. |
| 2003/0073315 | A1 | 4/2003 | Morita |
| 2004/0206299 | A1 | 10/2004 | Tadatomo et al. |
| 2005/0245095 | A1 | 11/2005 | Haskell et al. |
| 2006/0234486 | A1 | 10/2006 | Speck et al. |
| 2006/0286697 | A1 | 12/2006 | Leem |
| 2009/0166650 | A1 | 7/2009 | Huang et al. |
| 2009/0215248 | A1 | 8/2009 | Nakahata et al. |
| 2010/0032647 | A1 | 2/2010 | Khan et al. |
| 2010/0065854 | A1 | 3/2010 | Kamber et al. |
| 2010/0255621 | A1 | 10/2010 | Minato et al. |
| 2010/0327228 | A1 | 12/2010 | Bando et al. |
| 2011/0024880 | A1 | 2/2011 | Li et al. |
| 2011/0140072 | A1 | 6/2011 | Varangis et al. |
| 2011/0163295 | A1 | 7/2011 | Wu et al. |

FOREIGN PATENT DOCUMENTS

| | | |
|---|---|---|
| JP | 2008211250 A | 9/2008 |
| JP | 2010219269 A | 9/2010 |
| KR | 20100059499 A | 6/2010 |

OTHER PUBLICATIONS

Bai et al., "Reduction of threading dislocation densities in AlN/sapphire epilayers driven by growth mode modification," Applied Physics Letters, 2006, 4 pages.

Byrappa et al., Crystal Growth Technology, Foreword, Preface, and Summaries of chapters 1-17, 2002, 11 pages.

Han et al., "Self-Assembled Periodic Silica Nanosphere Arrays on Wet-Etched Patterned Sapphire Substrate for a High-Light-Extraction-Effiiency Light-Emitting Diode," IEEE Electron Device Letters, Apr. 2011, 3 pages, vol. 32 No. 4.

Jain et al., "Migration enhanced lateral epitaxial overgrowth of AlN and AlGaN for high reliability deep ultraviolet light emitting diodes," Applied Physics Letters, 2008, 4 pages, vol. 93.

Lee et al., "InGaN-Based High-Power Flip-Chip LEDs With Deep-Hole-Patterned Sapphire Substrate by Laser Direct Beam Drilling," IEEE Electron Device Letters, Jul. 2010, 3 pages, vol. 31 No. 7.

Nishinaga et al., "Epitaxial Growth of III-V Compounds," 1988, 4 pages.

Nishinaga et al., "Epitaxial Lateral Overgrowth of GaAs by LPE," Japanese Journal of Applied Physics, Jun. 1988, 4 pages, vol. 27 No. 6.

Shen, et al., "Nitride-Based High-Power Flip-Chip LED With Double-Side Patterned Sapphire Substrate," IEEE Photonics Technology Letters, May 2007, 3 pages, vol. 19, No. 10.

Suihkonen et al., "Patterning of sapphire/GaN substrates," Physica Status Solidi C, 2011, 4 pages, No. 5.

Wuu et al., "Fabrication of Pyramidal Patterned Sapphire Substrates for High-Efficiency InGaN-Based Light Emitting Diodes," Journal of the Electrochemical Society, 2006, 6 pages, vol. 153, No. 8.

Lee, H., U.S. Appl. No. 13/647,885, Notice of Allowance, dated Mar. 18, 2016, 11 pages.

Lee, H., U.S. Appl. No. 13/647,885, Final Office Action, dated Jan. 11, 2016, 14 pages.

Lee, H., U.S. Appl. No. 13/647,885, Office Action, dated Oct. 1, 2015, 40 pages.

Lee, H., U.S. Appl. No. 15/212,659, Office Action, dated Sep. 15, 2016, 23 pages.

Fulk, Steven, U.S. Appl. No. 13/647,902, Notice of Allowance, dated Apr. 7, 2015, 7 pages.

Fulk, Steven, U.S. Appl. No. 13/647,902, Office Action 1, dated Dec. 29, 2014, 25 pages.

Jain, et al., U.S. Appl. No. 14/822,508, Office Action 1, Oct. 13, 2016, 28 pages.

Park, International Application No. PCT/US2012/059468, "International Search Report and Written Opinion," dated May 15, 2013, 14 pages.

Translation of Office Action of the Intellectual Property Office of Taiwan, Taiwan Application No. 101137532, dated Aug. 11, 2014, 3 pages.

Lee, H., U.S. Appl. No. 15/212,659, Notice of Allowance, dated Feb. 7, 2017, 12 pages.

Jain, et al., U.S. Appl. No. 14/822,508, Notice of Allowance, dated Feb. 28, 2017, 28 pages.

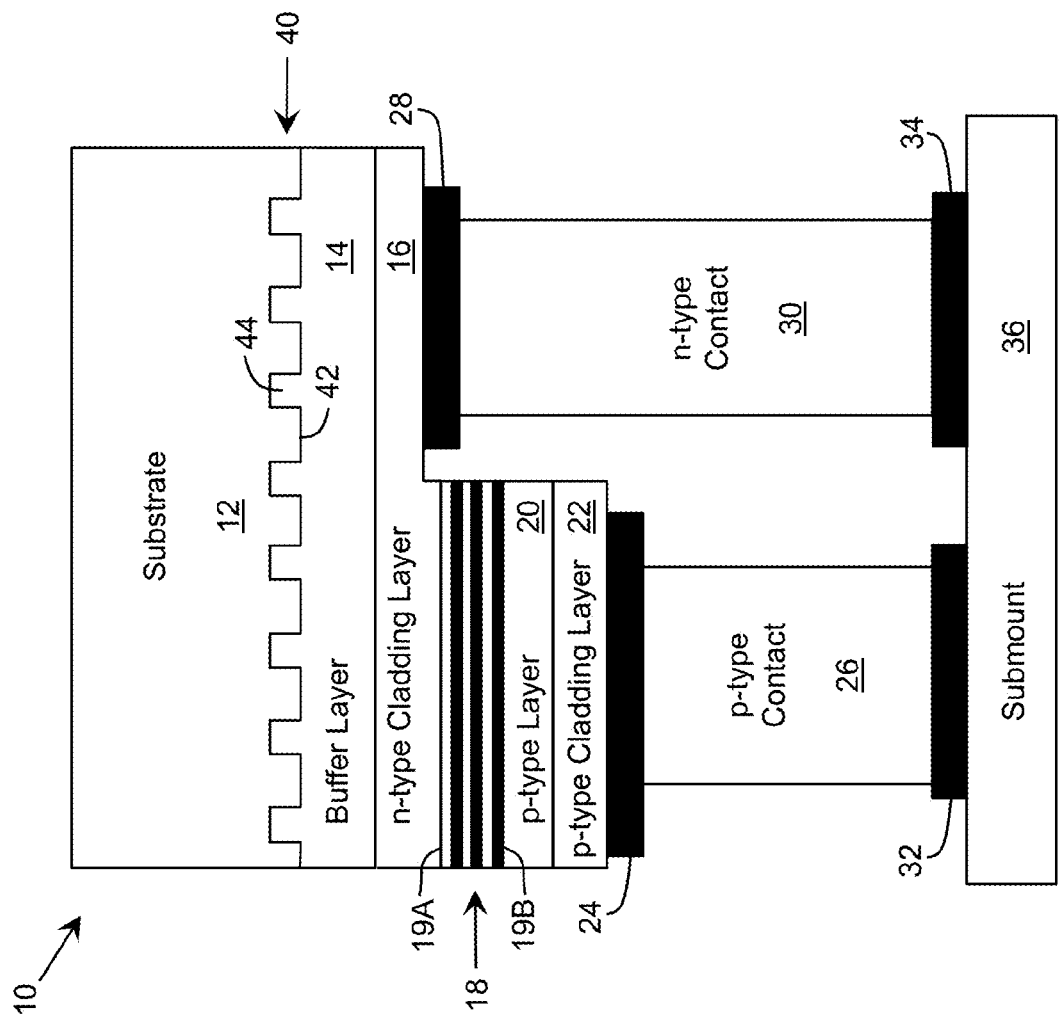

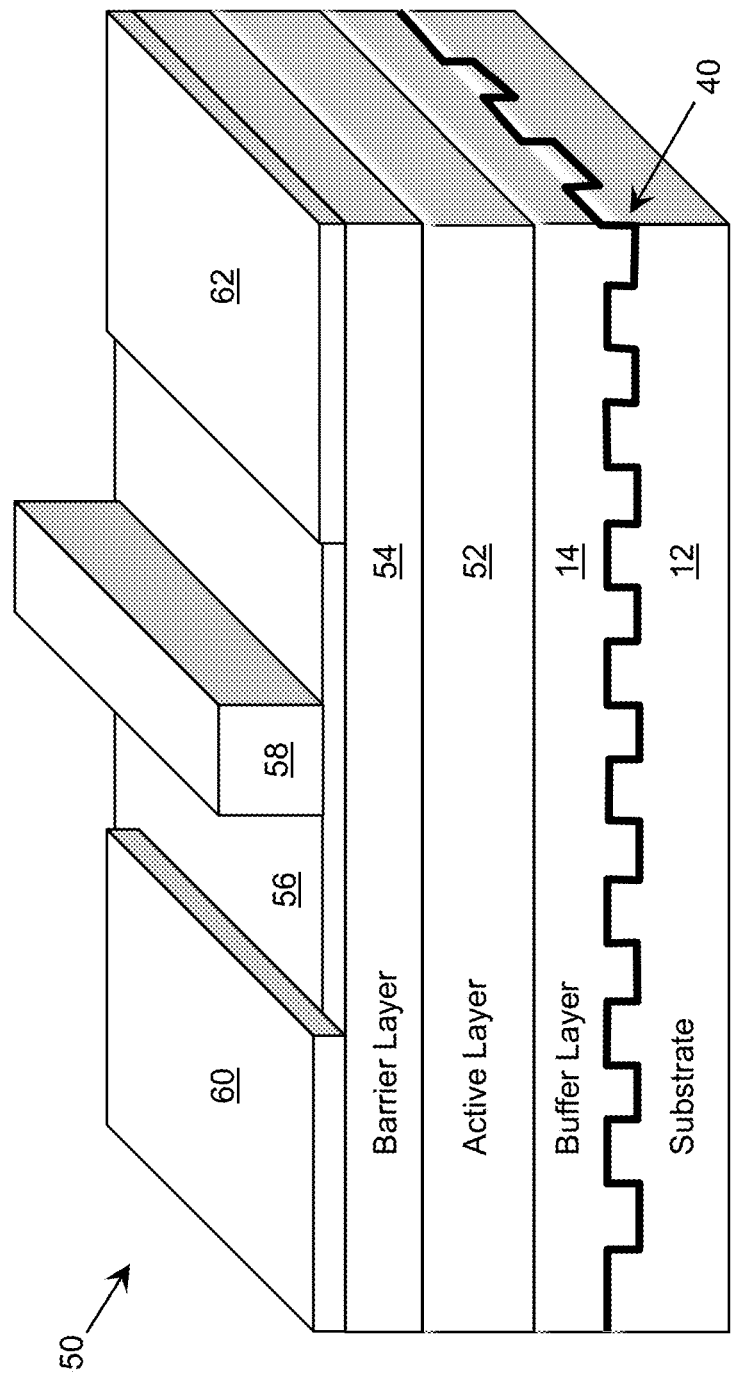

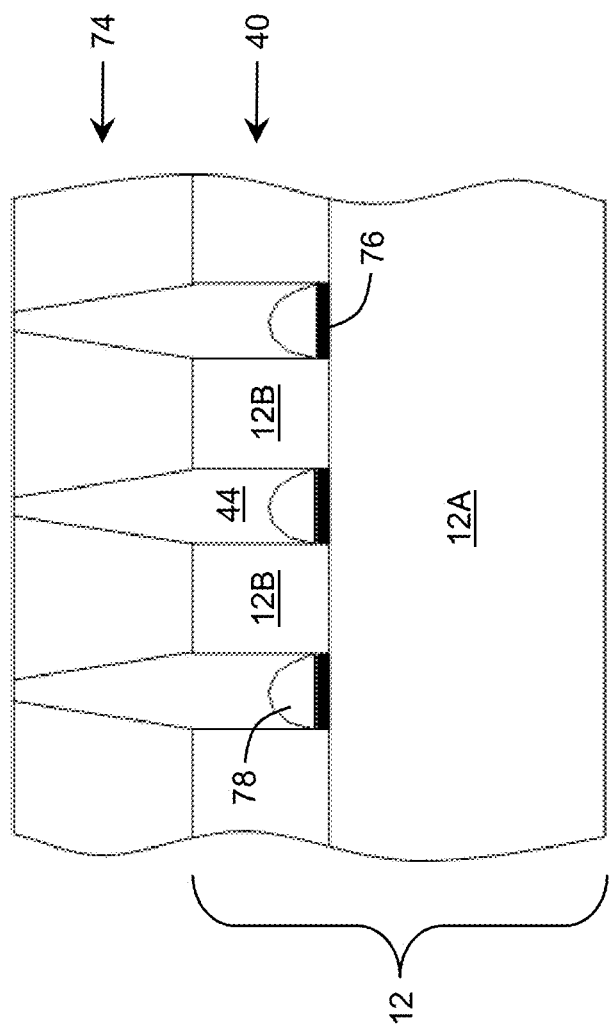

PATTERNED LAYER DESIGN FOR GROUP III NITRIDE LAYER GROWTH

REFERENCE TO RELATED APPLICATIONS

The present patent application is a continuation-in-part of U.S. patent application Ser. No. 15/212,659, filed on 18 Jul. 2016, which is a continuation of U.S. patent application Ser. No. 13/647,885, filed on 9 Oct. 2012, now U.S. Pat. No. 9,397,260, issued 19 Jul. 2016, which claims the benefit of U.S. Provisional Application No. 61/545,261, which was filed on 10 Oct. 2011, and U.S. Provisional Application No. 61/556,160, which was filed on 4 Nov. 2011, each of which is hereby incorporated by reference in its entirety to provide continuity of disclosure.

GOVERNMENT LICENSE RIGHTS

This invention was made with Federal government support under Contract No. W911 NF-10-2-0023 awarded by Defense Advanced Research Projects Agency (DARPA). The government has certain rights in the invention.

TECHNICAL FIELD

The disclosure relates generally to semiconductor devices, and more particularly, to a design of a patterned substrate for layer growth, e.g., group III-nitride layer and emitting device growth.

BACKGROUND ART

For light emitting devices, such as light emitting diodes (LEDs), and especially deep ultraviolet light emitting diodes (DUV LEDs), minimizing a dislocation density in the semiconductor layers increases the efficiency of the device. To this extent, several approaches have sought to grow dislocation free semiconductor layers on patterned substrates. Some approaches have proposed various patterning of the underlying substrate. For example, FIGS. 1 and 2 show uses of an overgrowing technique according to the prior art. The technique of FIG. 1 uses patterning of convex protrusions on the underlying substrate and overgrowing a gallium nitride (GaN) semiconductor layer. In the approach of FIG. 2, buildup of semiconductor material in patterned depressions is allowed. A reduction of dislocations may result due to an overall reduction of stress in the semiconductor layer. Another approach uses patterned nanopillars to reduce stress of an epitaxial layer.

Other approaches have used microchannel epitaxy (MCE). FIG. 3 shows an illustration of microchannel epitaxy according to the prior art. In these approaches, a narrow channel is used as a nucleation center containing low defect information from the substrate. An opening in a mask acts as a microchannel, which transfers crystal information to the overgrown layer, while the mask prevents dislocations from transferring to the overgrown layer. As a result, the overgrown layer can become dislocation free. The three-dimensional structure of the MCE also provides another advantage to stress release. The residual stress can be released effectively since the overgrown layer easily deforms. In another approach, a mask is applied at a location of a large concentration of dislocation densities to block their further propagation.

Another approach for controlling dislocations in aluminum nitride (AlN) and aluminum gallium nitride (AlGaN) layers first places seeds including dotted masks on the substrate or a template layer, and then grows the AlN or AlGaN layer over the substrate. The dislocations are attracted towards the center of the seeds and are accumulated there, thereby reducing the dislocation density at other portions of the layers.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the invention provide a device having a layer with a patterned surface for improving the growth of semiconductor layers, such as group III nitride-based semiconductor layers with a high concentration of aluminum. The patterned surface can include a substantially flat top surface and a plurality of stress reducing regions, such as openings. The substantially flat top surface can have a root mean square roughness less than approximately 0.5 nanometers, and the stress reducing regions can have a characteristic size between approximately 0.1 microns and approximately five microns and a depth of at least 0.2 microns. A layer of group-III nitride material can be grown on the first layer and have a thickness at least twice the characteristic size of the stress reducing regions.

A first aspect of the invention provides a device comprising: a first layer having a patterned surface, wherein the patterned surface includes a top surface having a root mean square roughness less than approximately 0.5 nanometers and a plurality of openings in the top surface, wherein each of the plurality of openings has a characteristic size between approximately 0.1 microns and approximately five microns and a depth of at least 0.2 microns; and a second layer directly on the patterned surface of the first layer, wherein the second layer is a group III-nitride material having an aluminum concentration of at least seventy percent and having a thickness at least twice the characteristic size of the openings.

A second aspect of the invention provides a light emitting device comprising: a substrate having a patterned surface, wherein the patterned surface includes a top surface having a root mean square roughness less than approximately 0.5 nanometers and a plurality of openings formed in the top surface, wherein each of the plurality of openings has a characteristic size between approximately 0.1 microns and approximately five microns and a depth of at least 0.2 microns; and a second layer directly on the substrate, wherein the second layer is a group III-nitride material having an aluminum concentration of at least seventy percent and having a thickness at least twice the characteristic size of the openings.

A third aspect of the invention provides a device comprising: a first layer having a patterned surface, wherein the patterned surface includes a top surface having a root mean square roughness less than approximately 0.5 nanometers and a first plurality of stress reducing regions on the top surface, wherein each of the first plurality of stress reducing regions has a characteristic size between approximately 0.1 microns and approximately five microns and wherein the first plurality of stress reducing regions are separated by a distance less than or equal to the characteristic size; and a second layer directly on the patterned surface of the first layer, wherein the second layer is a group III-nitride material having an aluminum concentration of at least seventy percent and having a thickness at least twice the characteristic size of the openings.

A fourth aspect of the invention provides a device, comprising: a first layer having a patterned surface, wherein the patterned surface includes a top surface having a root mean square roughness less than approximately 0.5 nanometers and a plurality of openings in the top surface, wherein each of the plurality of openings has a characteristic size between approximately 0.1 microns and approximately five microns and a depth of at least 0.2 microns; and a second layer directly on the patterned surface of the first layer, wherein the second layer is a group III-nitride material having an aluminum concentration of at least seventy percent and having a thickness at least twice the characteristic size of the openings, wherein the second layer includes a first sub-layer having a partially continuous interior portion with cavities formed therein.

A fifth aspect of the invention provides a light emitting device, comprising: a substrate having a patterned surface that includes a masking structure forming a periodic pattern, wherein the patterned surface includes a top surface having a root mean square roughness less than approximately 0.5 nanometers and a plurality of openings formed in the top surface, wherein each of the plurality of openings has a characteristic size between approximately 0.1 microns and approximately five microns and a depth of at least 0.2 microns; and a first layer directly on the substrate, wherein the first layer is a group III-nitride material having an aluminum concentration of at least seventy percent and having a thickness at least twice the characteristic size of the openings.

A sixth aspect of the invention provides a device, comprising: a substrate having a patterned surface, wherein the patterned surface includes a top surface having a root mean square roughness less than approximately 0.5 nanometers and a plurality of openings in the top surface, wherein each of the plurality of openings has a characteristic size between approximately 0.1 microns and approximately five microns and a depth of at least 0.2 microns; and a buffer layer directly on the patterned surface of the substrate, wherein the buffer layer is a group III-nitride material having an aluminum concentration of at least seventy percent and having a thickness at least twice the characteristic size of the openings, wherein the buffer layer includes: a first sub-layer directly on the patterned surface of the substrate layer, wherein the first sub-layer has a substantially flat top surface with a root mean square roughness less than approximately 0.5 nanometers and a first plurality of stress reducing regions; a second sub-layer directly on the top surface of the first sub-layer, wherein the second sub-layer has a substantially flat top surface with a root mean square roughness less than approximately 0.5 nanometers and a second plurality of stress reducing regions; and a third sub-layer directly on the top surface of the second sub-layer, and wherein each of the plurality of first and second stress reducing regions and the plurality of openings forms a lateral hexagonal arrangement and wherein the top surfaces are close-packed along a vertical direction to form an overall hexagonal close-packed three dimensional structure.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 4 shows a schematic structure of an illustrative emitting device according to an embodiment.

FIG. 5 shows a schematic structure of an illustrative heterostructure field effect transistor (HFET) according to an embodiment.

FIG. 10 shows an illustrative cross section of AlN material growth over a patterned substrate according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
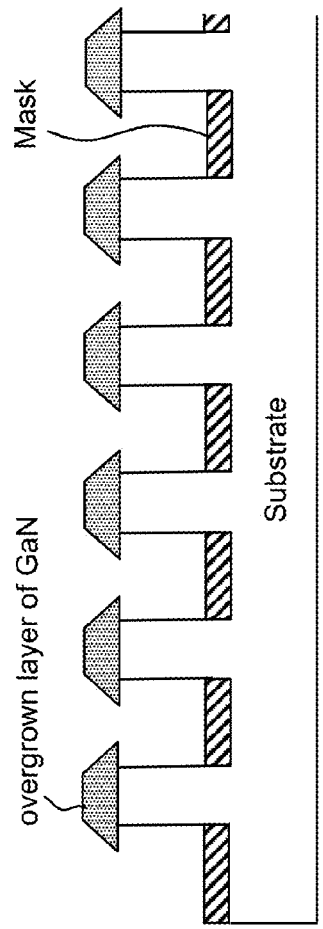
FIG. 1 shows use of an overgrowing technique according to the prior art.
Figure 2:
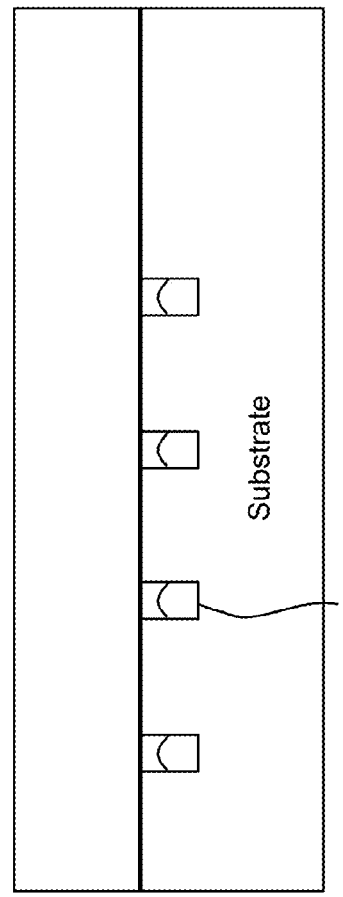
FIG. 2 shows another use of an overgrowing technique according to the prior art.
Figure 3:
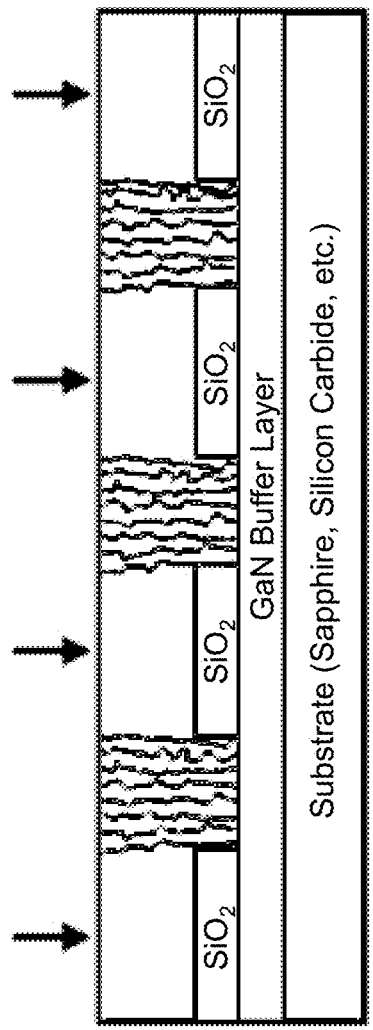
FIG. 3 shows an illustration of microchannel epitaxy according to the prior art.

As indicated above, aspects of the invention provide a device having a layer with a patterned surface for improving the growth of semiconductor layers, such as group III nitride-based semiconductor layers with a high concentration of aluminum. The patterned surface can include a substantially flat top surface and a plurality of stress reducing regions, such as openings. The substantially flat top surface can have a root mean square roughness less than approximately 0.5 nanometers, and the stress reducing regions can have a characteristic size between approximately 0.1 microns and approximately five microns and a depth of at least 0.2 microns. A layer of group-III nitride material can be grown on the first layer and have a thickness at least twice the characteristic size of the stress reducing regions. As used herein, unless otherwise noted, the term "set" means one or more (i.e., at least one) and the phrase "any solution" means any now known or later developed solution.

Turning to the drawings, FIG. 4 shows a schematic structure of an illustrative emitting device 10 according to an embodiment. In a more particular embodiment, the emitting device 10 is configured to operate as a light emitting diode (LED), such as a conventional or super luminescent LED. Alternatively, the emitting device 10 can be configured to operate as a laser diode (LD). In either case, during operation of the emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like.

The emitting device 10 includes a heterostructure comprising a substrate 12, a buffer layer 14 adjacent to the substrate 12, an n-type cladding layer 16 (e.g., an electron supply layer) adjacent to the buffer layer 14, and an active region 18 having an n-type side 19A adjacent to the n-type cladding layer 16. Furthermore, the heterostructure of the emitting device 10 includes a p-type layer 20 (e.g., an electron blocking layer) adjacent to a p-type side 19B of the active region 18 and a p-type cladding layer 22 (e.g., a hole supply layer) adjacent to the p-type layer 20.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \le W, X, Y, Z \le 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type cladding layer 16 and the p-type layer 20 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 20. The substrate 12 can be sapphire, silicon (Si), germanium, silicon carbide (SiC), a bulk semiconductor template material, such as AlN, GaN, BN, AlGaN, AlInN, AlON, $LiGaO_2$, AlGaBN, AlGaInN, AlGaInBN, and/or the like, or another suitable material, and can be polar, non-polar, or semi-polar. The buffer layer 14 can be composed of AlN, AlGaN, AlInN, AlGaBN, AlGaInN, AlGaInBN, an AlGaN/AlN superlattice, and/or the like.

As shown with respect to the emitting device 10, a p-type metal 24 can be attached to the p-type cladding layer 22 and a p-type contact 26 can be attached to the p-type metal 24. Similarly, an n-type metal 28 can be attached to the n-type cladding layer 16 and an n-type contact 30 can be attached to the n-type metal 28. The p-type metal 24 and the n-type metal 28 can form ohmic contacts to the corresponding layers 22, 16, respectively. In an embodiment, the p-type metal 24 and the n-type metal 28 each comprise several conductive and reflective metal layers, while the n-type contact 30 and the p-type contact 26 each comprise highly conductive metal. In an embodiment, the p-type cladding layer 22 and/or the p-type contact 26 can be at least partially transparent (e.g., semi-transparent or transparent) to the electromagnetic radiation generated by the active region 18. For example, the p-type cladding layer 22 and/or the p-type contact 26 can comprise a short period superlattice lattice structure, such as an at least partially transparent magnesium (Mg)-doped AlGaN/AlGaN short period superlattice structure (SPSL). Furthermore, the p-type contact 26 and/or the n-type contact 30 can be at least partially reflective of the electromagnetic radiation generated by the active region 18. In another embodiment, the n-type cladding layer 16 and/or the n-type contact 30 can be formed of a short period superlattice, such as an AlGaN SPSL, which is at least partially transparent to the electromagnetic radiation generated by the active region 18.

As used herein, a layer is at least partially transparent when the layer allows at least a portion of electromagnetic radiation in a corresponding range of radiation wavelengths to pass there through. For example, a layer can be configured to be at least partially transparent to a range of radiation wavelengths corresponding to a peak emission wavelength for the light (such as ultraviolet light or deep ultraviolet light) emitted by the active region 18 (e.g., peak emission wavelength +/− five nanometers). As used herein, a layer is at least partially transparent to radiation if it allows more than approximately 0.5 percent of the radiation to pass there through. In a more particular embodiment, an at least partially transparent layer is configured to allow more than approximately five percent of the radiation to pass there through. In a still more particular embodiment, an at least partially transparent layer is configured to allow more than approximately ten percent of the radiation to pass there through. Similarly, a layer is at least partially reflective when the layer reflects at least a portion of the relevant electromagnetic radiation (e.g., light having wavelengths close to the peak emission of the active region). In an embodiment, an at least partially reflective layer is configured to reflect at least approximately five percent of the radiation.

As further shown with respect to the emitting device 10, the device 10 can be mounted to a submount 36 via the contacts 26, 30. In this case, the substrate 12 is located on the top of the emitting device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the emitting device 10 can comprise a substantially uniform composition or a graded composition. For example, a layer can comprise a graded composition at a heterointerface with another layer. In an embodiment, the p-type layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the emitting device 10 described herein is only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure. For example, an illustrative emitting device/heterostructure can include an undoped layer between the active region 18 and one or both of the p-type cladding layer 22 and the n-type cladding layer 16.

Furthermore, an emitting device/heterostructure can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type cladding layer 22 and the active region 18. Similarly, a device/heterostructure can include a p-type layer located between the p-type cladding layer 22 and the active region 18. The DBR structure and/or the p-type layer can comprise any composition based on a desired wavelength of the light generated by the device/heterostructure. In one embodiment, the DBR structure comprises a Mg, Mn, Be, or Mg+Si-doped p-type composition. The p-type layer can comprise a p-type AlGaN, AlInGaN, and/or the like. It is understood that a device/heterostructure can include both the DBR structure and the p-type layer (which can be located between the DBR structure and the p-type cladding layer 22) or can include only one of the DBR structure or the p-type layer. In an embodiment, the p-type layer can be included in the device/heterostructure in place of an electron blocking layer. In another embodiment, the p-type layer can be included between the p-type cladding layer 22 and the electron blocking layer.

FIG. 5 shows a schematic structure of an illustrative heterostructure field effect transistor (HFET) 50 according to an embodiment. As illustrated, the HFET 50 can comprise a substrate 12, a buffer layer 14 formed thereon, an active layer 52 formed on the buffer layer 14, and a barrier layer 54 formed on the active layer 52. Additionally, the HFET 50 is shown including a gate passivation layer 56, on which a gate 58 is located, a source electrode 60, and a drain electrode 62. During operation of the HFET 50, the gate 58 can be used to control the flow of current along a device channel formed by the active layer 52 between the source electrode 60 and the drain electrode 62 using any solution.

In an embodiment, the HFET 50 is a group III-V materials based device, in which some or all of the various layers 14, 52, 54 are formed of elements selected from the group III-V materials system. In a more particular illustrative embodiment, the various layers of the HFET 50 are formed of group III nitride based materials as described herein. To this extent, the substrate 12 and the buffer layer 14 can be configured as described herein. In a still more particular illustrative embodiment, the active layer 52 is formed of GaN, and the barrier layer 54 is formed of AlInGaN. The gate passivation layer 56 can be formed of any type of dielectric material, such as silicon nitride ($Si_3N_4$), or the like. Each of the electrodes 62, 64 and the gate 58 can be formed of a metal.

While a light emitting device 10 (FIG. 4) and a HFET 50 are shown, it is understood that aspects of the invention can be utilized in the formation of any type of device. For example, the device can be a light detecting device, a photodetector, and/or the like. Similarly, while aspects of the invention are shown and described with respect to growth of a layer on a substrate 12, it is understood that any junction between two layers in a device heterostructure can include a patterned surface 40 as described herein. Additionally, aspects of the invention can be applied to the manufacture of non-electronic devices. For example, aspects of the invention can be used in the manufacture of an optical device such as a lens.

Regardless, as illustrated in FIGS. 4 and 5, each device 10, 50 can include a substrate 12 having a patterned surface 40. The patterned surface 40 can be configured to: provide for relaxation of stress buildup between the substrate 12 and an adjacent layer, such as the buffer layer 14; yield a semiconductor layer, such as the buffer layer 14, having a lower density of dislocations; and/or the like. To this extent, the patterned surface 40 can enable the growth of a single crystal semiconductor layer thereon.

The patterned surface 40 can be specifically configured to grow AlN and AlGaN semiconductor layers with an aluminum concentration higher than approximately seventy percent. In an embodiment, the buffer layer 14 is formed of AlN and/or AlGaN, and has an aluminum concentration higher than approximately seventy percent. The patterned surface 40 can comprise a set of top surfaces, such as the top surface 42, and a plurality of openings 44, which disrupt a continuity of the set of top surfaces 42. As described herein, each of the set of top surfaces 42 can be substantially flat, which can be configured to provide a set of epi-ready (e.g., ready for epilayer growth) top surfaces 42 for growth of the buffer layer 14. For example, for a substrate 12 formed of sapphire and a buffer layer 14 formed of aluminum nitride, the set of top surfaces 42 can have a root mean square roughness that is less than approximately 0.5 nanometers.

Figure 6B:
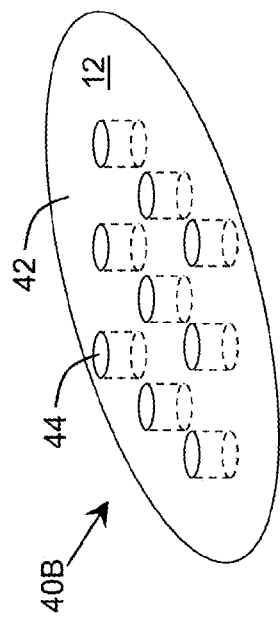
FIGS. 6A and 6B show illustrative patterned surfaces according to embodiments.
Figure 6A:
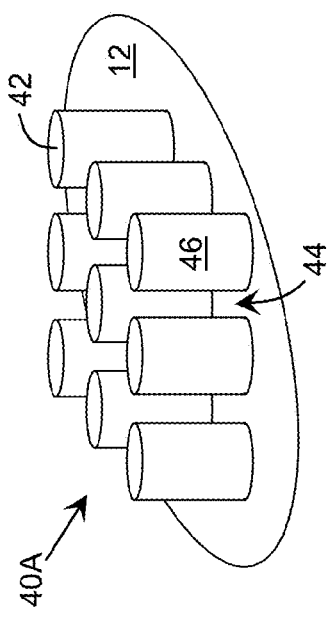

FIGS. 6A and 6B show illustrative patterned surfaces 40A, 40B according to embodiments. In FIG. 6A, the patterned surface 40A is formed by a plurality of protruding regions, such as the region 46, and a plurality of openings 44 between the protruding regions 46. Each protruding region 46 can have a substantially flat top surface 42 (e.g., a root mean roughness less than approximately 0.5 nanometers). As used herein, the top surface 42 of a protruding region 46 refers to the surface of the region 46 that is furthest from the substrate 12 and on which an adjacent layer will be formed. In an embodiment, a characteristic size (e.g., diameter) of the plurality of protruding regions 46 is between approximately 0.1 microns and approximately 5.0 microns. Furthermore, a characteristic size of the plurality of openings 44 between the plurality of protruding regions 46 can have a size less than or equal to the characteristic size of the plurality of protruding regions 46.

In FIG. 6B, the patterned surface 40B is formed by a plurality of openings 44 (e.g., depressions) present in a top surface 42 of the substrate 12. Each opening 44 can have a substantially vertical wall and a substantially flat bottom surface. For example, the bottom surface of the openings 44 and/or the top surface 42 of the substrate can have a root mean square roughness that is less than approximately 0.5 nanometers. In an embodiment, a characteristic size (e.g., diameter) of the openings 44 is between approximately 0.1 microns and approximately five microns. Furthermore, the openings 44 can be spaced from one another by gaps having a size less than approximately twice a diameter of the openings 44. In a more particular embodiment, the gaps have sizes less than approximately a diameter of the openings. In an embodiment, the openings 44 can have substantially circular cross sections and be formed in a lateral hexagonal pattern. However, it is understood that the openings 44 can comprise any combination of one or more of various types/shapes of cross-sectional patterns and form any type of pattern.

The patterned surfaces 40A, 40B can be formed using any solution. For example, for a substrate 12 formed of sapphire, AlN, or the like, the patterned surfaces 40A, 40B can be formed using a combination of lithography and etching. In an embodiment, the patterned surfaces 40A, 40B are formed using photolithography and wet chemical etching. However, it is understood that other types of lithography, such as e-beam, stepper, and/or the like, and/or other types of etching, such as dry etching, can be used.

During fabrication of a device 10 (FIG. 4), 50 (FIG. 5), a semiconductor layer, such as the buffer layer 14 (FIGS. 4 and 5), can be formed directly on the patterned surface 40 of the substrate 12. As described herein, the buffer layer 14 can have a high aluminum content (e.g., greater than seventy percent). For optimized growth conditions of AlN, $Al_xGa_{1-x}N$ with a high value for x (e.g., greater than 0.7), and the like, the material has a much lower ratio of lateral to vertical growth rates (1:2) as compared to GaN (>>1:1). As a result, to achieve lateral growth of AlN of one micron, the layer thickness must be increased by at least two microns. This leads to significant stress accumulation and wing tilt of the laterally overgrown material, which, in turn, causes the generation of defects (e.g., dislocations) after coalescence.

Figure 7B:
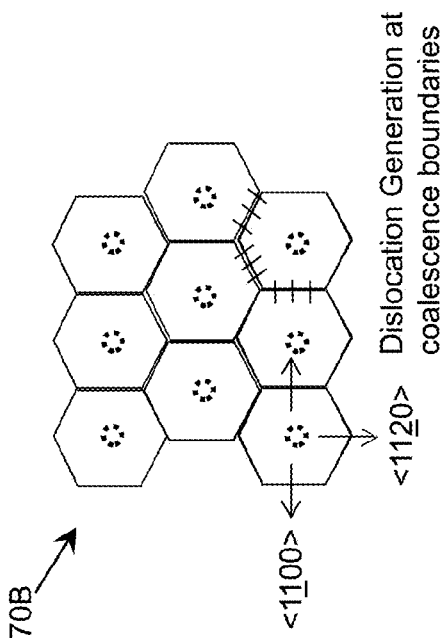
FIGS. 7A and 7B show illustrative material coalescence patterns for growth using different patterning lattices over a patterned substrate according to an embodiment.
Figure 7A:
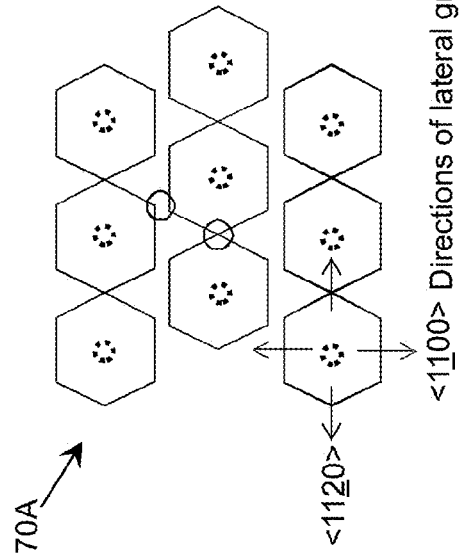

FIGS. 7A and 7B show illustrative material coalescence patterns 70A, 70B for growth using different patterning lattices over a patterned substrate according to an embodiment. In each case, the material can comprise AlN or AlGaN and the patterned substrate is formed using the convex protruding regions 46 as shown in FIG. 6A. In the material coalescence pattern 70A, coalescence starts at the corners of neighboring hexagons (indicated by circles), which creates boundaries for possible stress relaxation through the generation of dislocations or cracks. In the material coalescence pattern 70B, coalescence occurs along the sides of the neighboring hexagons, where stress relaxation can occur through the generation of dislocations or cracks.

Figure 8B:
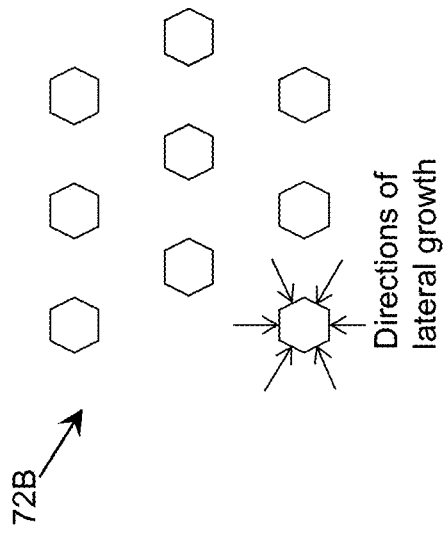
FIGS. 8A and 8B show illustrative material coalescence patterns for growth over the patterned substrates shown in FIGS. 6A and 6B, respectively, according to an embodiment.
Figure 8A:
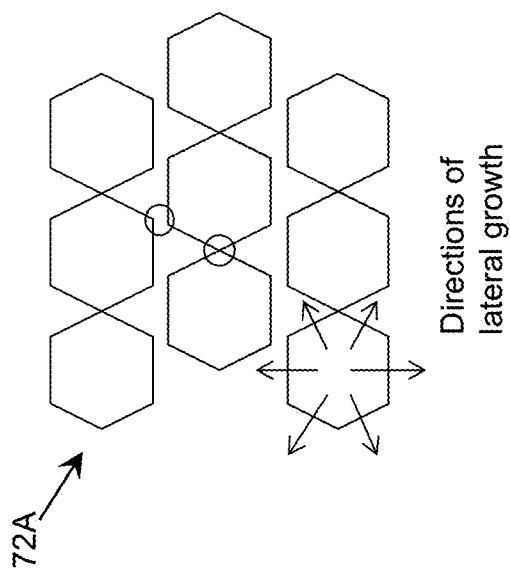

FIGS. 8A and 8B show illustrative material coalescence patterns 72A, 72B for growth over the patterned substrates 40A, 40B shown in FIGS. 6A and 6B, respectively, according to an embodiment. In each case, the material being grown can comprise AlN, AlGaN, or the like. As discussed herein, for growth over the patterned substrate 40A, the material coalescence pattern 72A includes various locations where dislocations and/or cracks can form. In contrast, for growth over the patterned substrate 40B, a majority of the surface can be flat, which is particularly suitable for epitaxial growth of AlN or AlGaN. As a result, the use of the patterned substrate 40B for the growth of these materials results in coalescence taking place primarily in a single point, thereby reducing an effect of dislocation regeneration and relaxation/cracking.

Figure 9:
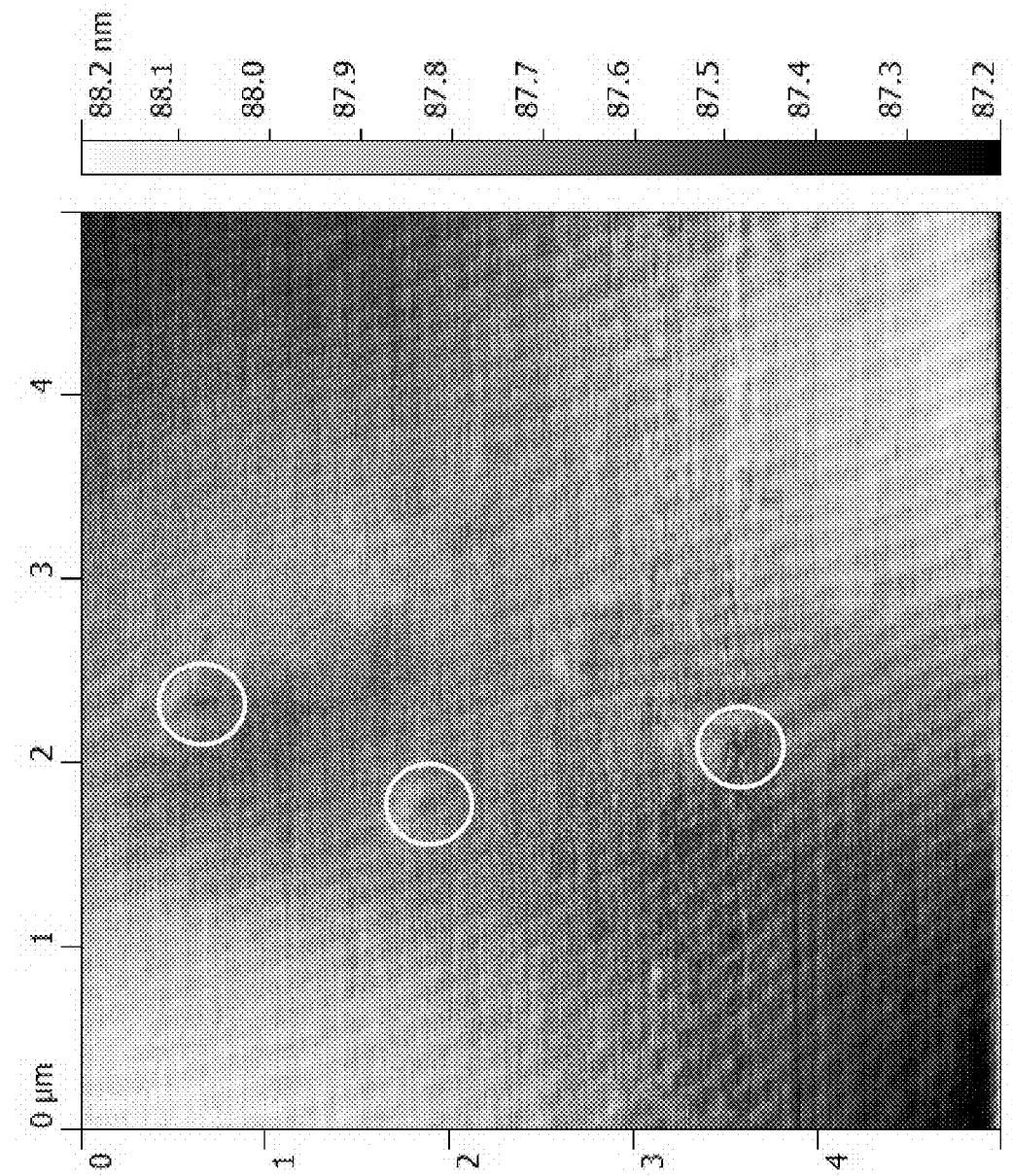
FIG. 9 shows an atomic force microscope (AFM) scan of an AlN or AlGaN layer grown on the patterned substrate of FIG. 6B according to an embodiment.

To this extent, the use of the patterned substrate 40B can provide a better surface for promoting the coalescence of laterally grown AlN and AlGaN than use of the patterned substrate 40A. In particular, the patterned surface 40B can include small features (e.g., concave depressions) and a dense pattern to promote coalescence of laterally grown AlN, AlGaN, and/or the like. FIG. 9 shows an atomic force microscope (AFM) scan of an AlN or AlGaN layer grown on the patterned substrate 40B according to an embodiment. The dots (some of which are circled in the figure) on the AFM scan indicate locations where the coalescence of dislocations has been achieved. The AFM root mean square (RMS) for the coalescence of the layer is less than 0.2 nanometers.

FIG. 10 shows an illustrative cross section of AlN material 74 growth over a patterned substrate 40 according to an embodiment. As illustrated, the patterned substrate 40 includes a plurality of openings 44, each of which can include a mask 76 located on a bottom surface thereof. The patterned substrate 40 can be formed using a composite substrate 12. For example, the substrate 12 can include a layer of a first material 12A, such as sapphire or the like, on which a template layer 12B including the various openings 44 formed therein is formed. The template layer 12B can comprise any type of suitable material for a growth initiation layer, such as AlN, AlGaN, or the like. The mask 76 can be any amorphous or polycrystalline material, including but not limited to silicon dioxide, silicon nitride, and the like. During growth of the AlN material 74, some polycrystalline material 78, can grow in the openings 44. The mask 76 can be configured to promote such growth. However, the openings 44 can be configured such that the overgrowth of the AlN material 74 occurs prior to the openings 44 filling with the polycrystalline material 78. In an embodiment, the openings 44 can have a diameter that is less than one half of a thickness of the semiconductor layer of material 74 being grown thereon. Furthermore, the openings 44 can have a depth of at least 0.2 microns.

Figure 11A:
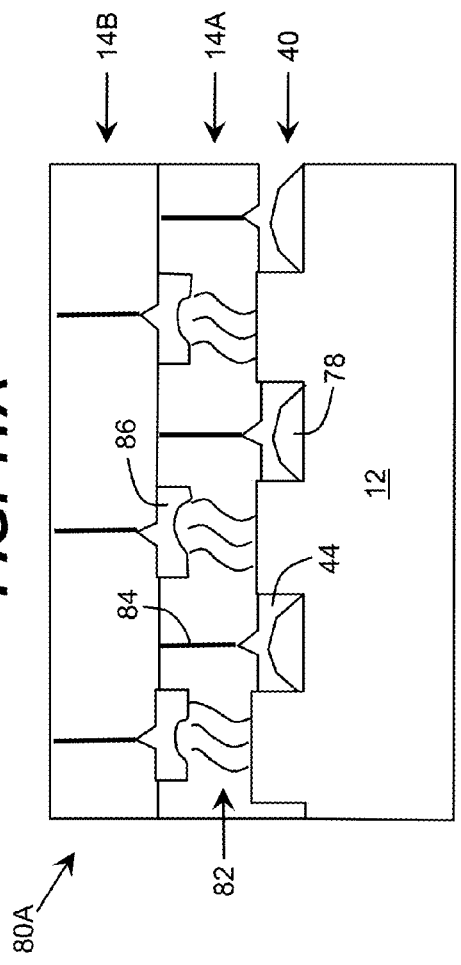
FIGS. 11A and 11B show schematic diagrams illustrating a multistep formation procedure according to embodiments.
Figure 11B:
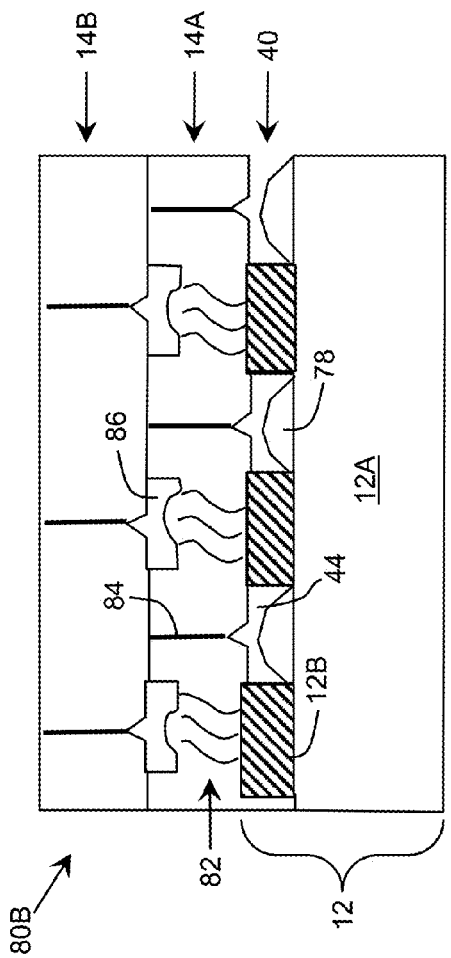

In an embodiment, one or more layers of the heterostructure can be formed using a multistep patterning and growing, e.g., epitaxy/etch, procedure. The multistep formation procedure can enable dislocations to be filtered out as the layer is grown. For example, FIGS. 11A and 11B show schematic diagrams 80A, 80B illustrating a multistep formation procedure according to embodiments. In the diagram 80A, the substrate 12 includes a single layer of material (e.g., sapphire, AlGaN buffer, and/or the like), which has a patterned surface 40. In the diagram 80B, a composite substrate 12 is used, which includes a layer of a first material 12A (e.g., sapphire, AlGaN, and/or the like), and a template layer 12B formed thereon, which includes a pattern of openings 44 as described herein to form the patterned surface 40.

In either case, a first sub-layer 14A can be grown over the patterned surface 40. The sub-layer 14A can include one or more high dislocation regions 82, one or more dislocations 84 due to coalescence of adjacent regions, and/or the like. After growing the first sub-layer 14A, a top surface of the sub-layer 14A can be patterned with a set of stress reducing regions, such as a second plurality of openings 86. The openings 86 can be formed such that the openings 86 are vertically offset from the openings 44 in the patterned surface 40. For example, the openings 86 and the openings 44 can form a vertical checkerboard arrangement. In this manner, the growth of a layer can include multiple levels of openings, where adjacent levels of openings are vertically shifted with respect to one another. In an embodiment, each level of openings is formed using a mask, which is vertically shifted with respect to the underlying layer forming a periodic structure with at least two sub-layers 14A, 14B.

Figure 12:
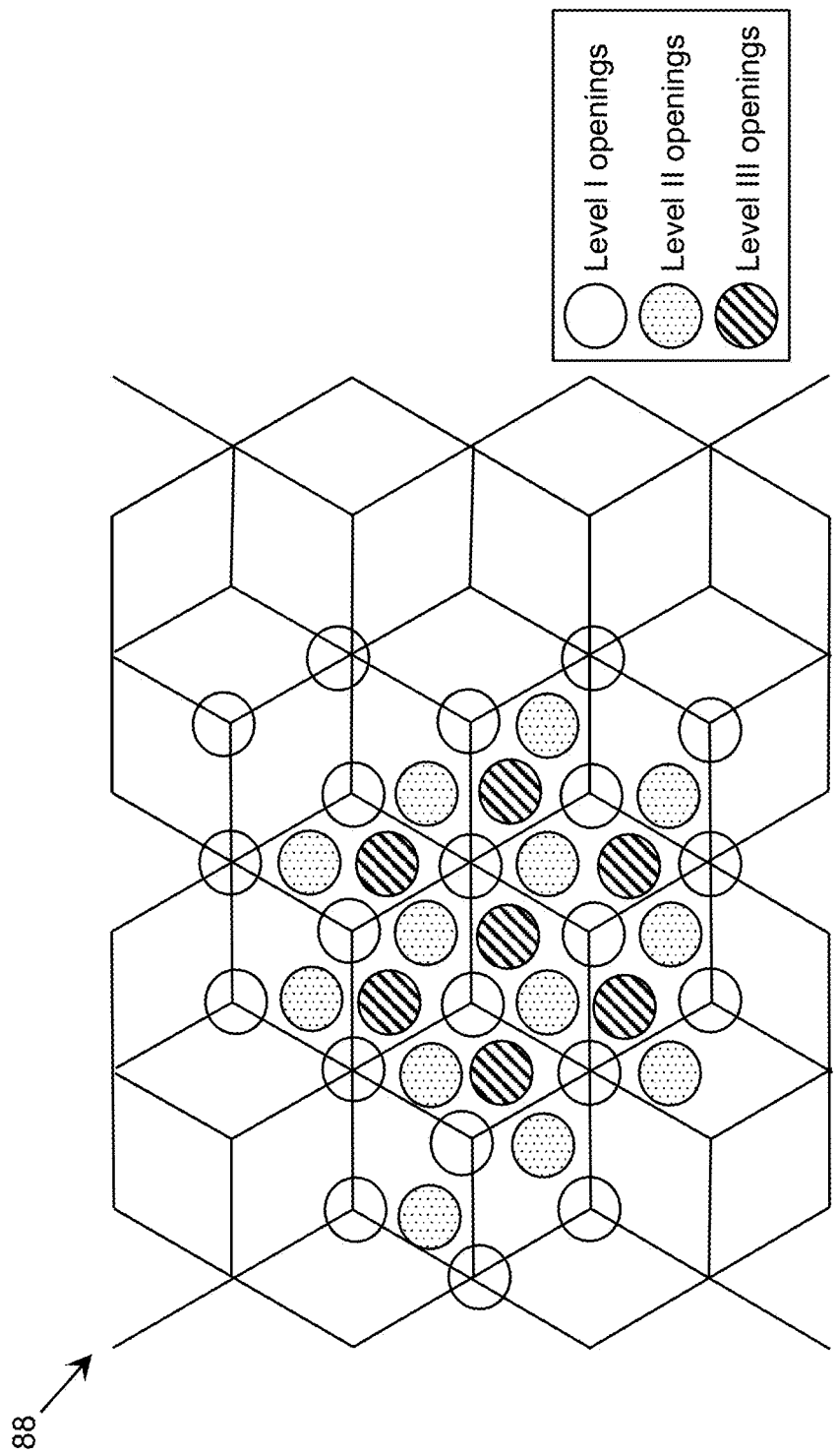
FIG. 12 shows a top view of an illustrative layer formed using multiple sub-layers according to an embodiment.

In an embodiment, multiple patterns can be used in forming a layer (e.g., a unique pattern for each sub-layer 14A, 14B). The patterns can form any of two Bravais lattices, which can form either multilayer Bravais structures, polytypes, or the like, where symmetry and/or periods can change from one sub-layer to the next. FIG. 12 shows a top view of an illustrative layer 88 formed using multiple sub-layers according to an embodiment. The layer 88 can be formed of an AlN/AlGaN material using a multistep patterning and growing, e.g., epitaxy/etch, procedure and a close packed patterning lattice. Additionally, each level can include a pattern of openings having a lateral hexagonal arrangement. As illustrated, such a lattice enables placement of the patterned openings for one level to be located between the patterned openings of a previous level and formation of an overall hexagonal close-packed three dimensional arrangement.

Figure 13:
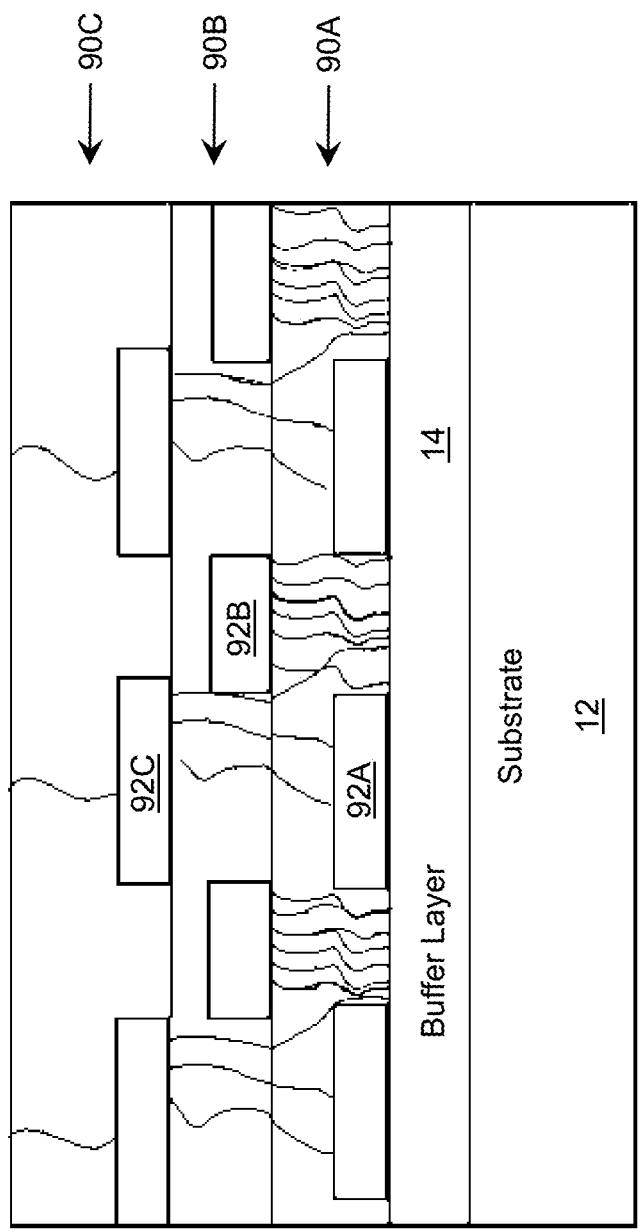
FIG. 13 shows a schematic diagram of an illustrative multistep layer formation according to another embodiment.

While aspects of the invention have been primarily described with respect to the use of openings to provide a roughening pattern for relaxation of stress buildup, a lower density of dislocations, and/or the like, it is understood that alternative solutions can be used to provide stress reducing regions. To this extent, FIG. 13 shows a schematic diagram of an illustrative multistep layer formation according to another embodiment. In this case, the roughening pattern includes a set of masks 92A, which are formed on the buffer layer 14 prior to growth of a first sub-layer 90A. The masks 92A enable the growth of low dislocation regions in the regions of the sub-layer 90A located above the masks 92A. After growth of the sub-layer 90A, a second set of masks 92B are formed thereon, and a second sub-layer 90B is grown. As illustrated, the second set of masks 92B can be vertically offset from the first set of masks 92A, and can block high dislocation regions, which can form between the masks 92A, from further vertically propagating. Similarly, a third set of masks 92C can be formed on the second sub-layer 90B and a third sub-layer 90C can be grown thereon. As can be seen, a number of dislocations within the sub-layer 90C can be substantially lower than a number of dislocations present in the lowest sub-layer 90A.

The substrate 12 can be sapphire, the buffer layer 14 can be AlN, AlGaN, or the like, and each of the sub-layers 90A-90C can be formed of AlN, GaN, AlGaN, or the like. The masks 92A-92C can be formed of any material having a low affinity for aluminum adatoms. For example, the masks 92A-92C can be formed of carbon or a carbon based material, such as graphite, graphene, nanocrystalline diamond, or the like. While three sub-layers 90A-90C are shown, it is understood that any number of sub-layers 90A-90C can be grown. Furthermore, while the sets of masks 92A-92C are shown including two alternating patterns of masks, it is understood that any number of mask patterns can be used to form a periodic pattern of any number of dimensions (e.g., one, two, or three). While the multistep patterning process is shown and described in conjunction with growing a single layer of a heterostructure, it is understood that the process can be used to grow multiple layers of the heterostructure. For example, each sub-layer can be a distinct layer of the heterostructure rather than a portion of a layer.

Figure 14:
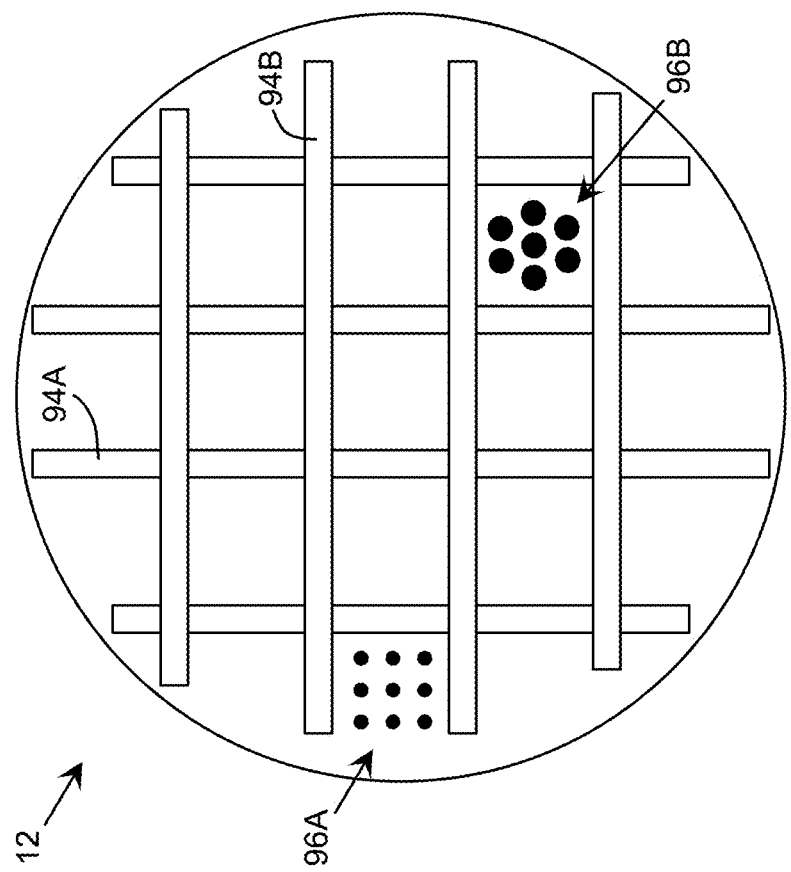
FIG. 14 shows a top view of an illustrative patterned surface of a substrate according to an embodiment.

In an embodiment, a surface of a substrate 12 can include multiple patterns. For example, FIG. 14 shows a top view of an illustrative patterned surface of a substrate 12 according to an embodiment. In this case, the substrate 12 includes a plurality of stripes, such as stripes 94A and 94B, of an isolating material. The isolating material can comprise silicon dioxide, silicon nitride, a carbon based material, or any amorphous or polycrystalline material. As illustrated, the stripes 94A, 94B can form a plurality of regions, such as regions 96A and 96B, each of which is isolated from another region by the stripes 94A, 94B. Each region 96A, 96B can comprise a patterned surface configured as described herein. Furthermore, the plurality of regions 96A, 96B can include patterned surfaces formed using a different solution and/or having different attributes. In this manner, each region 96A, 96B can comprise a configuration, which is suitable for stress reduction through lateral epitaxial overgrowth, selective area growth, selective polycrystalline growth, and/or the like.

In an embodiment, one or more aspects of the pattern are configured based on radiation desired to pass through the corresponding interface. For example, a characteristic size of the pattern, a distance between the patterning regions (e.g., openings or masks), a depth of the pattern (e.g., opening or mask depth), and/or the like, can be selected based on a target wavelength of the radiation. In an embodiment, the distance between adjacent masks or openings can be greater than the target wavelength. Furthermore, a characteristic size of the opening or mask can be in a range from approximately 0.25 times to approximately five times the distance between adjacent masks or openings. The target wavelength can be selected based on a peak wavelength of radiation desired to pass through the patterned surface(s) during operation of a device, such as the device 10 (FIG. 4), and can be within any range of wavelengths, including visible light, ultraviolet radiation, deep ultraviolet radiation, infrared light, and/or the like. In an embodiment, the target wavelength corresponds to the peak wavelength of the radiation generated in the active region 18 (FIG. 4) of the device 10.

Furthermore, one or more patterned surfaces described herein can be configured to form a photonic crystal in the lateral and/or vertical directions of a heterostructure. Additionally, a patterned surface described herein can be configured to increase a scattering of diffusive light between the substrate and a semiconductor layer or between adjacent semiconductor layers. Similarly, one or more attributes of a pattern, such as a density of the openings/masks, a characteristic size, and/or the like, can vary laterally or between patterns spaced vertically to provide, for example, a gradient in an effective refractive index of the resulting layer(s), control of the refractive index, manipulate the deflection of radiation passing through the structure, and/or the like.

Figure 15:
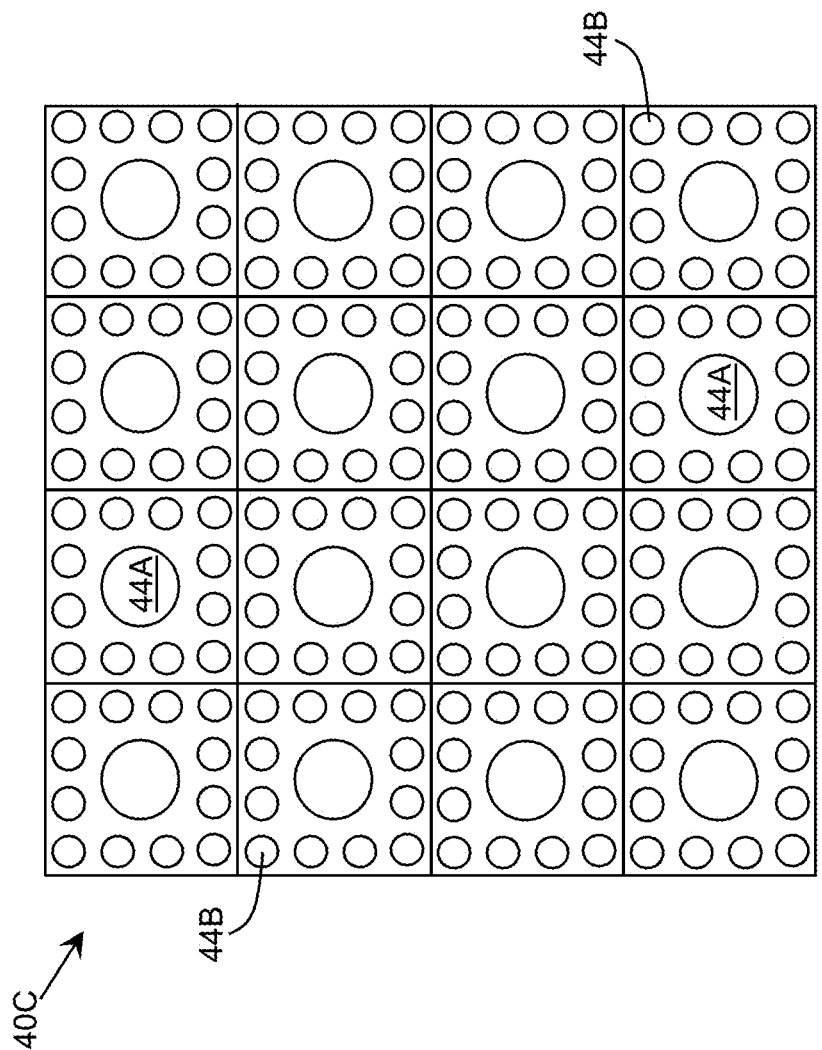
FIG. 15 shows an illustrative patterned surface according to an embodiment.

For example, FIG. 15 shows an illustrative patterned surface 40C according to an embodiment. In this case, the patterned surface 40C includes two distinct scales. In particular, a set of large scale openings 44A (e.g., micron size openings) can be included and configured to improve a quality of the semiconductor layers grown over the patterned surface 40C, e.g., by reducing a number of dislocations present in the semiconductor layers. Furthermore, a set of small scale openings 44B (e.g., nano size openings such as in a range between approximately 40-150 nanometers) can be included and configured based on at least one light propagation property for the device, e.g., to improve and/or adjust one or more attributes of light propagation (e.g., extraction) to/from the semiconductor layers. To this extent, the small scale openings 44B can be formed in a periodic structure. Additionally, the small scale openings 44B can comprise lattice constants in lateral and/or vertical directions that are different than the lattice constants corresponding to the large scale openings 44A. In an embodiment, the set of large scale openings 44A has a periodic pattern defined by a Bravais set of lattice constants L1 and the set of small scale openings 44B has a periodic pattern defined by a Bravais set of lattice constants L2, where at least some elements of the set L2 are different from the corresponding elements of the set L1. Alternatively, the large scale openings 44A and/or the small scale openings 44B can be aperiodic.

Figure 16:
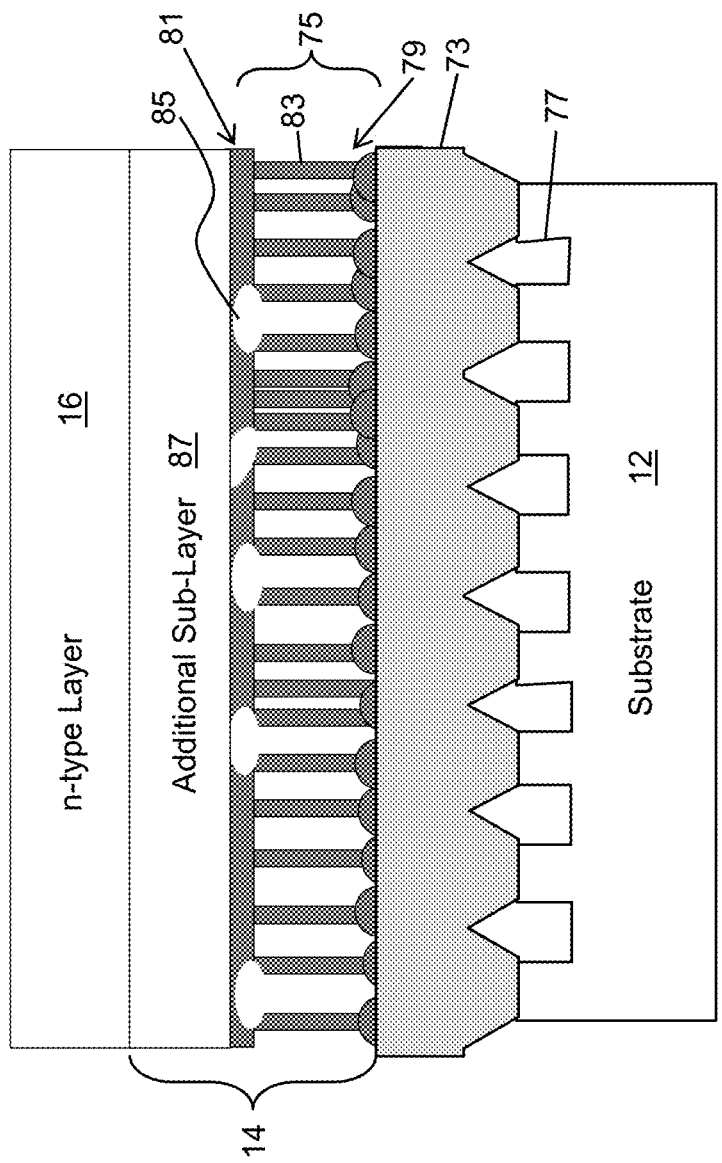
FIG. 16 shows a schematic diagram of a semiconductor layer and a structured semiconductor layer formed over a patterned substrate according to an embodiment.

FIG. 16 shows a schematic diagram of a semiconductor layer 73 and a structured semiconductor layer 75 formed over a substrate 12 having a patterned top surface 77 according to an embodiment. In this embodiment, the semiconductor layer 73 can be formed over the patterned top surface 77 of the substrate 12 using epitaxial growth. The semiconductor layer 73 can comprise group III nitride semiconductors such as AlN, AlxGa1-xN or AlxInyGa1-x-yN.

The structured semiconductor layer 75 can include more than one sub-layer. In one embodiment, as shown in FIG. 16, the structured semiconductor layer 75 can include a sub-layer 79 and another immediately adjacent sub-layer 81. Although the structured semiconductor layer 75 is shown in FIG. 16 with two sub-layers, it is understood that the number of sub-layers is only illustrative and is not meant to be limiting as more than two sub-layers may be used.

In one embodiment, the sub-layer 79 can include a plurality of columnar structures 83. The columnar structures 83 can further reduce the dislocations that may form in the layers of the semiconductor structure located above the structured semiconductor layer 75. In addition, the columnar structures 83 can be used to reduce stresses within any subsequently grown semiconductor layers. The columnar structures 83 can include three-dimensional columnar structures separated from each other by gaps, which can comprise air. In one embodiment, the columnar structures 83 can include nanowires, or pillar structures having a diameter in the range of a few microns to a few nanometers. The pillar structures or nanowires can have a diameter that is varied along the growth direction. The columnar structures 83 can be grown on the semiconductor layer 73 using any solution. For example, the columnar structures 83 can be epitaxially grown on the semiconductor layer 73 using growth strategies outlined in U.S. Pat. No. 9,330,906, entitled, "Stress Relieving Semiconductor Layer", issued on 3 May 2016, which is incorporated herein by reference. Further, the columnar structures 83 can be characterized by having a characteristic spacing (e.g., gap width), a characteristic diameter, and a characteristic length. In one embodiment, the columnar structures 83 can exhibit a high ratio of characteristic length versus characteristic diameter (e.g., greater than five or greater than ten in a more specific embodiment). In a more particular embodiment, the characteristic spacing for the columnar structures 83 can be in a range of two to one hundred nanometers, the characteristic separation for the columnar structures 83 can be in a range of ten to five hundred nanometers, and the characteristic length can be in a range of fifty nanometers to five microns. In addition, the columnar structures 83 can be characterized with hexagonal lateral cross-sections, however, it is understood that the columnar structures can have any of various cross-sections.

In one embodiment, the sub-layer 81 can include a partially continuous interior portion with cavities 85 formed therein to provide stress reduction in the corresponding sub-layer 81. In an embodiment, the cavities 85 can be continuous or isolated, and can have a characteristic width in a range of 1-500 nm, a characteristic height in a range of 10 nm to 5 μm, and a volumetric density within a cavity containing layer of at least 0.1 percent. As shown in FIG. 16, the columnar structures 83 can contact the sub-layer 81 without penetrating into any of the cavities 85. In this manner, the sub-layer 81 can physically connect at least some of the columnar structures 83 of the sub-layer 79. In one embodiment, the sub-layer 81 can be grown directly on the sub-layer 79. For example, the sub-layer 81 can be grown on the sub-layer 79 to a height that is at least 200 nm. Further, the sub-layer 81 can be grown on the sub-layer 79 such that its interior portion is partially continuous. As used herein, a partially continuous interior portion means that the sub-layer 81 fills at least fifty percent of the lateral area in this section of the structured semiconductor 75. U.S. patent application Ser. No. 14/519,230, entitled "Heterostructure Including a Composite Semiconductor Layer", filed 21 Oct. 2014, provides additional details on a heterostructure that includes a sub-layer having a partially continuous interior portion with cavities and a sub-layer with columnar structures, and is incorporated herein by reference.

The structured semiconductor layer 75 can be part of a buffer layer 14 that is formed between the n-type semiconductor layer 16 and the semiconductor layer 73 formed on the patterned top surface 77 of the substrate 12. In one embodiment, both the sub-layer 79 and the sub-layer 81 that form the multi-layered structured semiconductor layer 75 can include a set of tensile and compressive layers. For example, either one of the sub-layer 79 and the sub-layer 81 can form a tensile layer while the other one of these sub-layers can form the other of the tensile and compressive layer. In one embodiment, the set of tensile and compressive layers can be grown by varying a V/III ratio for group III nitride semiconductor layers that can be used to form the sub-layer 79 and the sub-layer 81. U.S. patent application Ser. No. 13/756,806, entitled "Epitaxy Technique for Reducing Threading Dislocations in Stressed Semiconductor Compounds," filed 1 Feb. 2013, provides more details regarding a layered structure having a set of tensile and compressive layers grown by varying a V/III ratio for group III nitride semiconductor layers, and is incorporated herein by reference. A similar technique is also outlined in U.S. patent application Ser. No. 13/692,191, entitled "Epitaxy Technique for Growing Semiconductor Compounds", filed 3 Dec. 2012, and is incorporated herein by reference. In one embodiment, the set of tensile and compressive layers can include changes in the V/III ratio that is at least 5% between the sub-layer 79 and the sub-layer 81.

As shown in FIG. 16, the buffer layer 14 can include an additional sub-layer 87 as a complement to the sub-layer 79 and the sub-layer 81 that form the structured semiconductor layer 75. In one embodiment, the additional sub-layer 87 can include a superlattice epitaxially grown directly on the sub-layer 81. In one embodiment, the superlattice can include group III nitride semiconductor layers with a composition that can be varied from one neighboring layer to another. The additional sub-layer 87 can be an essentially continuous semiconductor layer containing at most ten percent voids (i.e., at least ninety percent of the lateral area is covered by the essentially continuous sub-layer 87).

The composite buffer layer 14 that includes the structured semiconductor layer 75 formed from the sub-layer 79 and the sub-layer 81, and the additional sub-layer 87 can be configured to provide a surface on which various layers of a heterostructure for an optoelectronic device, such as light emitting device, can be epitaxially grown. For example, the n-type layer 16, an active structure, and/or the like, can be formed on the buffer layer 14. To this extent, the structured semiconductor layer 75 can be configured to decrease a number of threading dislocations at the top of the composite buffer layer 14 that could be present using a conventional growth approach. In one embodiment, the composite buffer layer 14 can be patterned prior to growth of a set of semiconductor layers.

In a still more particular embodiment, the buffer layer 14, and any subsequent semiconductor layers (e.g., n-type layer 16, active layer 18) thereon can be formed of group III nitride materials. To this extent, each of sub-layers 79, 81, 87 of the buffer layer 14 can be formed of any type of group III nitride semiconductor alloy, $B_W Al_X Ga_Y In_Z N$, where $0 \leq W$, X, Y, Z≤1, and W+X+Y+Z=1. The composition of each sub-layer 79, 81, 87 can be similar or different in composition from one or all of the other sub-layers. For example, in one embodiment, the composition between layers including any sub-layers can vary by at 2%. In an illustrative embodiment, the sub-layer 79 can include columnar structures 83 formed of AlN, which is a material having a low absorption to radiation in the ultraviolet wavelength range.

Figure 17:
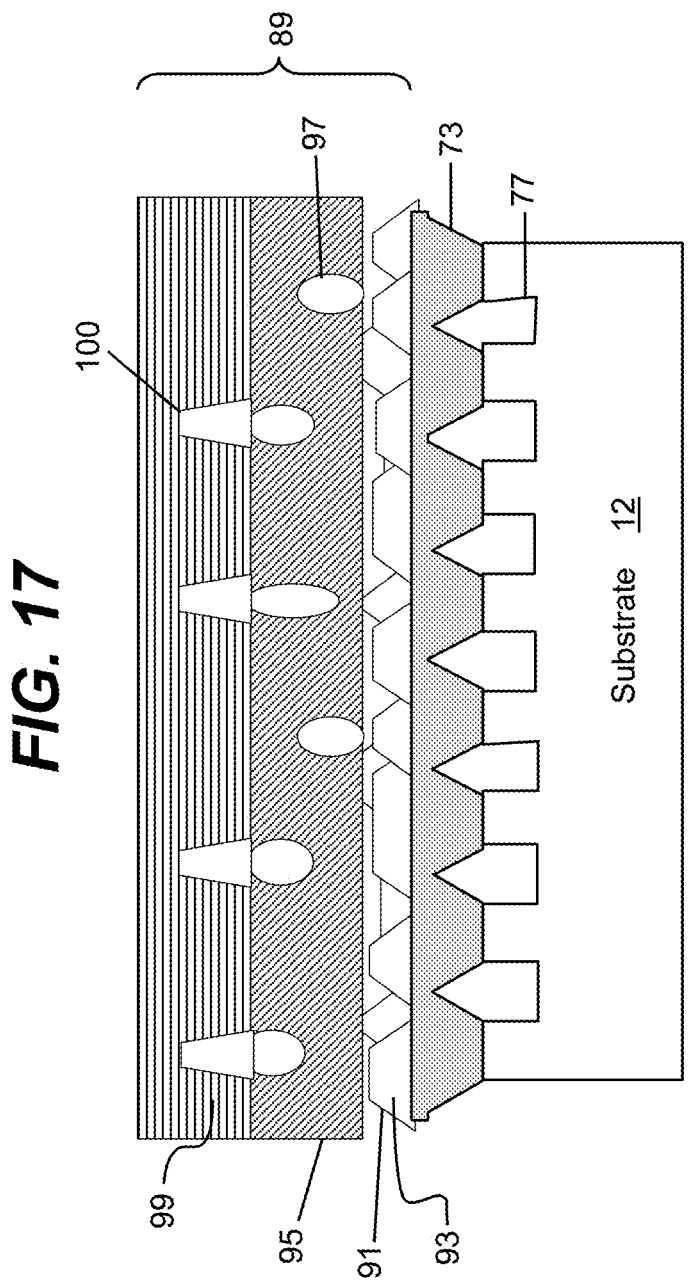
FIG. 17 shows a schematic diagram of a semiconductor layer and an alternative structured semiconductor layer formed over a patterned substrate according to an embodiment.

FIG. 17 shows a schematic diagram of the semiconductor layer 73 and an alternative structured semiconductor layer 89 formed over the semiconductor layer 73 according to an embodiment. The structured semiconductor layer 89 of FIG. 17 can include a nucleation layer 91 having a plurality of nucleation islands 93. The nucleation layer 91 and its nucleation islands 93 can reduce a number of dislocations formed in other layers of the structured semiconductor layer 89, which can include a first cavity layer 95 having a plurality of cavities 97, and a second cavity layer 99 having a plurality of cavities 100. Both the first cavity layer 95 and the second cavity layer 99 can act as a stress-relieving layer in the structure depicted in FIG. 17.

The cavity containing layers 95 and 99 can have any thickness. For example, the thickness of the cavity containing layers 95 and 99 can range between approximately 1 micron and 10 microns. The cavities 97 and 100 can be of various sizes (e.g., lateral size, and/or height) and have various distribution and densities throughout the cavity containing layers 95 and 99, respectively. For example, the characteristic size of the cavities 97 and 100 can be at least one nanometer. Furthermore, the cavities 97 and 100 can have any of various characteristic separations amongst adjacent cavities in a respective layer. In an embodiment, a characteristic separation of the cavities 97 and 100 (e.g., as determined by a shortest distance between the edges of two adjacent cavities) can be at least approximately 5 nanometers. Regardless, as described herein, the characteristic size of the cavities 97 and 100 present in the cavity containing layers 95 and 99, respectively, can be determined by the growth parameters such as growth temperature, pressure, V/III ratio, molar concentration, and/or the like, used during epitaxial growth of these cavity containing layers.

The nucleation layer 91 and cavity layers 97 and 99 can be epitaxially grown on the semiconductor layer 73. For example, the nucleation layer 91 can be epitaxially grown directly on the semiconductor layer 73. Growth of the nucleation layer 91 can include growth of the plurality of nucleation islands 93 at a growth temperature and a V/III ratio configured to result in the various nucleation islands. For example, the growth temperature can be in a range of approximately 700° C. and approximately 1050° C., and the V/III ratio can be in a range between approximately 1000 and approximately 20000. During growth of the nucleation layer 91, a typical size in of the nucleation islands 93 in both a lateral direction and a vertical direction can be controlled by adjusting a V/III ratio used during the growth.

The cavity containing layers 95 and 99 can be epitaxially grown directly on the nucleation layer 91. In an embodiment, growth of the cavity containing layers 95 and 99 can be configured to result in one or more of the cavities (voids) 97, 100 being present in the cavity containing layers 95 and 99, respectively. For example, growth of the cavity containing layers 95 and 99 can be performed at a relatively high temperature, which can be approximately a few hundred degrees Celsius higher than a temperature used for growth of the nucleation layer 91. A characteristic size of the nucleation islands 93 can control a characteristic size and density of cavities 97, 100 present in the cavity containing layers 95 and 99, respectively, due to a correlation between the size of the nucleation islands and the spacing of cavities. For example, as cavities can form at some, but not necessarily all, boundaries of the nucleation islands 93, the cavities can be further apart. By growing the cavity containing layers 95, 99 on the nucleation layer 91 with nucleation islands 93 having large lateral sizes, a density of cavities 97, 100 present in the cavity containing layers 95 and 99, respectively, can be reduced, which can significantly reduce a number of threading dislocations.

Furthermore, a temperature and/or V/III ratio used during growth of the cavity containing layers 95, 99 can control a characteristic vertical size of the cavities 97, 100, respectively, e.g., by altering a lateral growth rate of the island formations in the cavity containing layers. The presence of the cavities 97, 100 in the cavity containing layers 95, 99, respectively can reduce internal stresses, threading dislocations, and cracks in the semiconductor layers of the structure depicted in FIG. 17.

As shown in FIG. 17, the cavities 97 and 100 present in the cavity containing layers 95 and 99, respectively, can be grown using growth conditions which will induce scale cavities to be present. In one embodiment, the first cavity containing layer 95 and the second cavity containing layer 99 can have cavities formed in top and/or bottom sections. For example, FIG. 17 shows that the first cavity containing layer 95 can have cavities 97 formed in both a top and a bottom section, while the second cavity containing layer 99 can have cavities 100 formed in a bottom section. In one embodiment, some of the cavities 97 in the top section of the first cavity containing layer 95 can be in substantial vertical alignment with the cavities 100 of the second cavity containing layer 99. In this manner, the cavities 97 in the top section of the first cavity containing layer 95 can extend into the cavities 100 in the bottom section of the second cavity containing layer 99. Despite this interaction, the cavities 100 of the second cavity containing layer 99 can vary in shape and/or size from the cavities 97 present in the first cavity containing layer 95.

In one embodiment, the nucleation layer 91 and the cavity layers 95, 99 can be formed of aluminum nitride (AlN)-based materials. While the nucleation layer 91 and the cavity layers 95, 99 are described as being distinct layers, when the layers 91, 95 and 99 are formed of a uniform composition of AlN as described in the below example, the structured layer 89 can be considered as having a single layer formed using three distinct growth periods (each of which corresponds to the layers 91, 95 and 99). Regardless, it is understood that the example below is only illustrative, and a similar method (but with different ranges for the growth conditions) can be applied to fabricate a semiconductor structure illustrated in FIG. 17 including layers 91, 95 and 99 formed of any combination of one or more types of compositions, such as any type of $Al_xIn_yB_zGa_{1-x-y-z}N$, where $0 \le x, y, z \le 1$ and $0 \le x+y+z \le 1$, alloy layers. In an illustrative embodiment, the aluminum molar fraction, x, is at least 0.8.

Growth conditions for an AlN-based nucleation layer 91 can be configured to induce three-dimensional growth. For example, a growth temperature for the nucleation layer 91 can be in a range between approximately 600° C. and 1300° C. and a V/III ratio can be in a range between approximately 100 and approximately 50000. Use of a higher V/III ratio enhances vertical growth rate and restrains lateral growth. To this extent, the V/III ratio and/or time period for the growth can be adjusted to provide a target characteristic size of the islands 93 in the nucleation layer 91. Additionally, formation of the nucleation layer 91 can use dissimilar materials including, for example, indium nitride (InN), gallium nitride (GaN), aluminum nitride (AlN), silicon nitride (SiN), any of their alloys, and/or the like.

Growth conditions for AlN-based cavity containing layers 95, 99 can be configured to induce island growth and the presence of cavities 97, 100, respectively, within the cavity containing layers. For example, a growth temperature for the cavity containing layers 95, 99 can be in a range between approximately 800° C. and 1500° C. and a V/III ratio can be more than approximately 100, e.g., in a range between approximately 100 and approximately 10000. The V/III ratio can be adjusted based on a target lateral growth rate, which can adjust a vertical dimension of the cavities 97, 100. Additionally, additional auxiliary agents (e.g., precursors), such as zinc oxide (ZnO), titanium nitride (TiN), SiN, gallium arsenide (GaAs), aluminum arsenide (AlAs), GaN, InN, and/or the like, can be used to induce cavities within the cavity containing layers 95, 99, thereby altering the elastic properties of the cavity containing layers.

In one embodiment, the nucleation layer 91 and the cavity containing layers 95 and 99 can be grown with a flux of one or more additional precursors. Illustrative precursors include: trimethylaluminum, trimethylgallium, trimethylindium, triethylgallium, triethylboron, and/or the like. The precursor fluxes can be delivered at flow rate(s) of at least one micro-moles per minute.

The structured semiconductor layer 89 formed from the nucleation layer 91 and the cavity containing layers 95 and 99 can be configured to provide a surface on which various layers of a heterostructure for an optoelectronic device such as light emitting device can be epitaxially grown. For example, the previously mentioned n-type layer 16, an active structure, and/or the like can be formed on the cavity containing layers 95 and 99. In an embodiment, any additional semiconductor layers that are formed on the cavity containing layer 95 and 99 can be formed without any cavities therein. As mentioned above, any subsequent semiconductor layers can be formed of the aforementioned group III nitride materials as can the structured semiconductor layer 89 and its various sub-layers.

Additional details of a semiconductor structure formed from a nucleation layer with nucleation islands and one or more cavity containing layers is provided in U.S. Pat. No. 9,330,906, entitled, "Stress Relieving Semiconductor Layer", issued on 3 May 2016, which as previously noted, is incorporated herein by reference.

Returning to FIGS. 4 and 5, it is understood that a device 10, 50, or a heterostructure used in forming a device 10, 50, including one or more patterned surfaces 40 as described herein, can be fabricated using any solution. For example, a device/heterostructure can be manufactured by obtaining (e.g., forming, preparing, acquiring, and/or the like) a substrate 12, forming the patterned surface 40 of the substrate (e.g., by etching, growing a template layer, and/or the like), and forming (e.g., growing) another layer thereon. In an embodiment, the growth of one or more layers of the heterostructure includes periodic growth of self-assembly structures on a patterned surface. The growth of such structures can be implemented by varying one or more growth conditions (e.g., a growth temperature), a ratio of elements (e.g., group V/group III ratio), and/or the like. Such a growth process can modulate an internal strain in epi-layers and result in a substantially crack-free semiconductor (e.g., group III nitride) layer. Additionally, it is understood that the formation of any combination of one or more layers of the device can include forming one or more patterned surfaces 40 as described herein. Furthermore, one or more metal layers, contacts, and/or additional layers can be formed using any solution. The heterostructure/device also can be attached to a submount via contact pads using any solution.

It is understood that the fabrication of the emitting device/heterostructure can include the deposition and removal of a temporary layer, such as mask layer, the patterning one or more layers, such as the substrate 12 as described herein, the formation of one or more additional layers not shown, and/or the like. To this extent, a patterned surface 40 can be fabricated using any combination of deposition and/or etching. For example, the fabrication can include selective deposition and/or etching of nanoscale objects, such as nanodots and/or nanorods, and/or micro-scale objects, such as micro-holes, of the material to form a patterned surface described herein. Such deposition and/or etching can be used to form periodic and/or non-periodic random patterns.

The patterning of a layer, such as the substrate 12, can be performed using any solution. For example, the patterning can include defining a set of regions on a top surface of the layer for etching using, for example, photolithography to apply a photoresist defining the set of regions, or the like. The set of openings having a desired pattern can be formed, e.g., by etching in the set of defined regions of the layer. Subsequently, the photoresist can be removed from the surface. Such a process can be repeated one or more times to form a complete pattern on the layer. The patterning of a layer also can include applying (e.g., depositing) a mask (e.g., silicon dioxide, a carbon based material, or the like) over a second set of regions on the top surface of the layer. When the pattern also includes a set of openings, the second set of regions can be entirely distinct from the locations of the set of openings. Furthermore, as described herein, the formation of a layer can include multiple repetitions of the patterning process. In this case, each repetition can vary from the previous repetition in one or more aspects. For example, a repetition can include both applying a mask and forming openings on a surface, only forming openings, only applying a mask, and/or the like. Additionally, as described herein, the locations of the masked and/or opening portions for a repetition can be vertically offset from the locations of the adjacent repetition.

Figure 18:
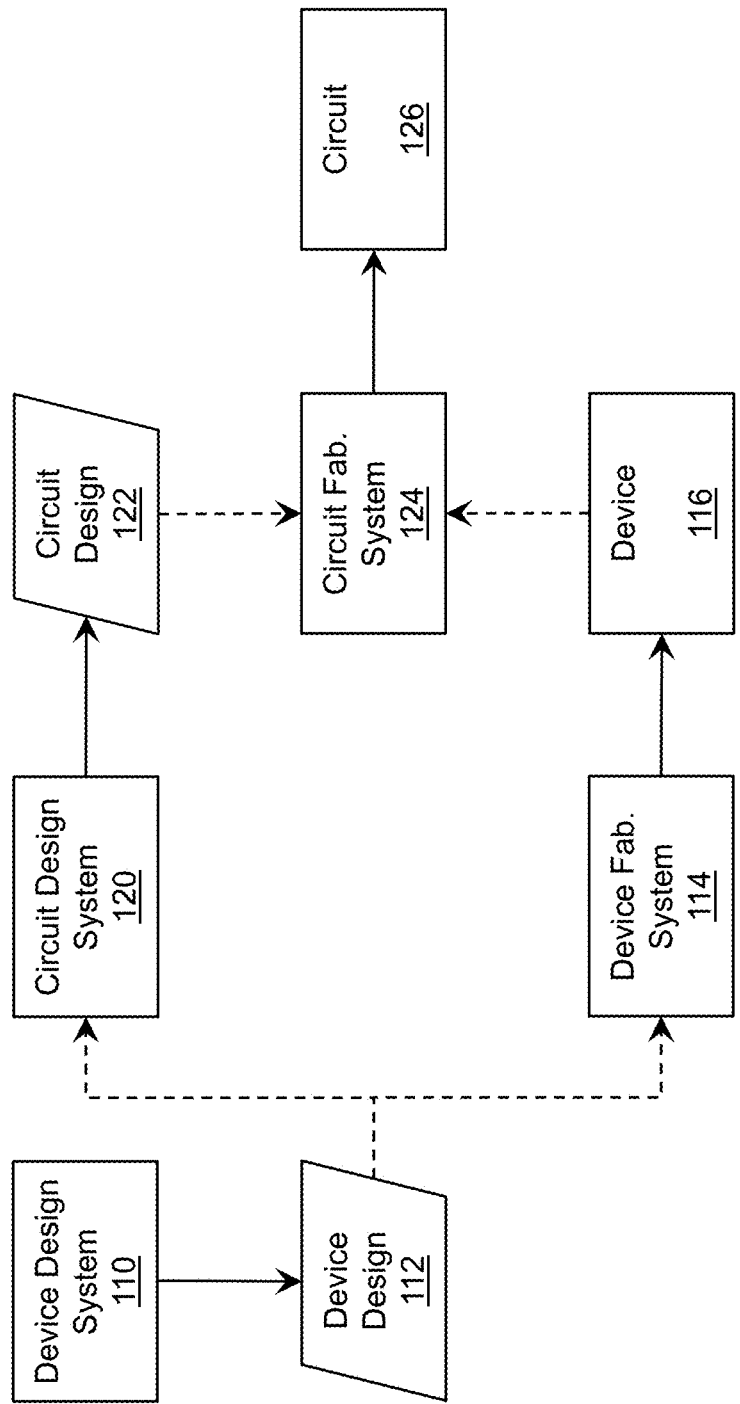
FIG. 18 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 18 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device, comprising:
a first layer having a patterned surface, wherein the patterned surface includes a top surface having a root mean square roughness less than approximately 0.5 nanometers and a plurality of openings in the top surface, wherein each of the plurality of openings has a characteristic size between approximately 0.1 microns and approximately five microns and a depth of at least 0.2 microns; and
a second layer directly on the patterned surface of the first layer, wherein the second layer is a group III-nitride material having an aluminum concentration of at least seventy percent and having a thickness at least twice the characteristic size of the openings, wherein the second layer includes a first sub-layer having a partially continuous interior portion with cavities formed therein, and a second sub-layer immediately adjacent to the first sub-layer, the second sub-layer comprising at least one of: a plurality of columnar structures or a plurality of islands, formed immediately adjacent the first sub-layer.

2. The device of claim 1, wherein the second sub-layer comprises the plurality of columnar structures, wherein the plurality of columnar structures contact the first sub-layer without penetrating into any of the cavities.

3. The device of claim 2, wherein the second sub-layer comprises AlN.

4. The device of claim 2, wherein the first sub-layer and the second sub-layer form a multi-layered structure having a set of tensile and compressive layers, wherein the first sub-layer comprises one of the tensile and compressive layers, while the second sub-layer comprises the other of the tensile and compressive layers.

5. The device of claim 4, wherein the set of tensile and compressive layers comprise group III nitride semiconductor layers, wherein the set of tensile and compressive layers are grown by varying a V/III ratio for the group III nitride semiconductor layers.

6. The device of claim 5, wherein the set of tensile and compressive layers include changes in the V/III ratio that are at least 5% between the first sub-layer and the second sub-layer.

7. The device of claim 1, wherein the second sub-layer includes the plurality of islands, and wherein the second sub-layer comprises a nucleation layer having nucleation islands formed immediately adjacent the first sub-layer.

8. The device of claim 7, wherein the first sub-layer comprises at least one cavity containing semiconductor layer having a plurality of cavities formed therein, wherein the nucleation layer is formed between the at least one cavity containing semiconductor layer and the first layer.

9. The device of claim 8, wherein each of the plurality of cavities of the cavity containing semiconductor layer has a characteristic size at least one nanometer and a characteristic separation with adjacent cavities of at least 5 nanometers.

10. A light emitting device, comprising:
a substrate having a patterned surface that includes a masking structure forming a periodic pattern, wherein the patterned surface includes a top surface having a root mean square roughness less than approximately 0.5 nanometers and a plurality of openings formed in the top surface, wherein each of the plurality of openings has a characteristic size between approximately 0.1 microns and approximately five microns and a depth of at least 0.2 microns; and a first layer directly on the substrate, wherein the first layer is a group III-nitride material having an aluminum concentration of at least seventy percent and having a thickness at least twice the characteristic size of the openings, the first layer including:
  a first sub-layer directly on the substrate, the first sub-layer including a top patterned surface including a plurality of stress reducing regions; and
  a second sub-layer grown directly on the top patterned surface of the first sub-layer.

11. The device of claim 10, wherein the periodic pattern forms a photonic crystal in one of a lateral direction and a vertical direction.

12. The device of claim 10, wherein the plurality of openings and the plurality of stress reducing regions are vertically offset to form a vertical checkerboard pattern.

13. The device of claim 10, wherein the patterned surface includes a plurality of patterns, each pattern formed in a different region of the surface, each region having a boundary formed by a plurality of vertical stripes extending across the patterned surface in a vertical direction and a plurality of horizontal stripes extending across the patterned surface in a horizontal direction.

14. The device of claim 10, wherein the first layer further comprises a third sub-layer grown directly on the second sub-layer.

15. A device, comprising:
  a substrate having a patterned surface, wherein the patterned surface includes a top surface having a root mean square roughness less than approximately 0.5 nanometers and a plurality of openings in the top surface, wherein each of the plurality of openings has a characteristic size between approximately 0.1 microns and approximately five microns and a depth of at least 0.2 microns; and
  a buffer layer directly on the patterned surface of the substrate, wherein the buffer layer is a group III-nitride material having an aluminum concentration of at least seventy percent and having a thickness at least twice the characteristic size of the openings, wherein the buffer layer includes:
    a first sub-layer directly on the patterned surface of the substrate layer, wherein the first sub-layer has a substantially flat top surface with a root mean square roughness less than approximately 0.5 nanometers and a first plurality of stress reducing regions;
    a second sub-layer directly on the top surface of the first sub-layer, wherein the second sub-layer has a substantially flat top surface with a root mean square roughness less than approximately 0.5 nanometers and a second plurality of stress reducing regions; and
    a third sub-layer directly on the top surface of the second sub-layer, and wherein each of the plurality of first and second stress reducing regions and the plurality of openings forms a lateral hexagonal arrangement and wherein the top surfaces are close-packed along a vertical direction to form an overall hexagonal close-packed three dimensional structure.

16. The device of claim 15, wherein the first sub-layer, the second sub-layer and the third sub-layer each comprises a plurality of masks formed therein.

17. The device of claim 16, wherein the masks of the second sub-layer are vertically offset from the masks in the first sub-layer and the third sub-layer.

18. The device of claim 17, wherein the masks of the second sub-layer are formed over dislocation regions within the first sub-layer.

19. The device of claim 16, wherein the plurality of masks of the first sub-layer, the second sub-layer and the third sub-layer form a periodic pattern.

20. The device of claim 16, wherein the plurality of masks comprise a material having an affinity for aluminum adatoms.

* * * * *